United States Patent
Kim et al.

(10) Patent No.: US 11,921,158 B2
(45) Date of Patent: Mar. 5, 2024

(54) FAN-OUT BUFFER WITH SKEW CONTROL FUNCTION, OPERATING METHOD THEREOF, AND PROBE CARD INCLUDING THE SAME

(71) Applicant: Samsung Electronics Co., Ltd., Suwon-si (KR)

(72) Inventors: Byung-Sung Kim, Suwon-si (KR); Yun-Hyok Choi, Suwon-si (KR); Gyuyeol Kim, Suwon-si (KR); Sungjung Kim, Suwon-si (KR); Cheol-Heui Park, Suwon-si (KR); Sanghoon Lee, Suwon-si (KR); Jae-Woong Choi, Suwon-si (KR)

(73) Assignees: SAMSUNG ELECTRONICS CO., LTD.; Research & Business Foundation SUNGKYUNKWAN UNIVERSITY

( * ) Notice: Subject to any disclaimer, the term of this patent is extended or adjusted under 35 U.S.C. 154(b) by 0 days.

(21) Appl. No.: 18/075,542

(22) Filed: Dec. 6, 2022

(65) Prior Publication Data
US 2023/0333160 A1 Oct. 19, 2023

(30) Foreign Application Priority Data
Apr. 15, 2022 (KR) .................. 10-2022-0047103

(51) Int. Cl.
*G01R 31/3177* (2006.01)
*G01R 1/073* (2006.01)
(Continued)

(52) U.S. Cl.
CPC ..... *G01R 31/3177* (2013.01); *G01R 1/07314* (2013.01); *G01R 23/165* (2013.01);
(Continued)

(58) Field of Classification Search
CPC ............ G01R 31/3177; G01R 1/07314; G01R 23/165; G01R 25/04; G01R 31/31713;
(Continued)

(56) References Cited

U.S. PATENT DOCUMENTS 6,084,930 A * 7/2000 Dinteman ................. G06F 1/08
375/377
6,192,092 B1 2/2001 Dizon et al.
(Continued)

OTHER PUBLICATIONS

M. Z. Mohd Rodzi et al., Detection of Faulty Pilot Cable Using Altera Cyclone II Board with Time-Domain Reflection (TDR) Technique, 2010, IEEE, pp. 125-130. (Year: 2010).*
(Continued)

*Primary Examiner* — John J Tabone, Jr.
(74) *Attorney, Agent, or Firm* — Muir Patent Law, PLLC

(57) ABSTRACT

Disclosed is a fan-out buffer which includes a first channel that includes a first delay circuit adjusting a first delay time of a calibration test signal depending on a first delay control signal, a second channel that includes a second delay circuit adjusting a second delay time of the calibration test signal depending on a second delay control signal, a first edge-to-pulse converter that detects a first edge included in a first time domain reflectometry (TDR) waveform of an output terminal of the first channel and generates a first start pulse signal including a first pulse, a second edge-to-pulse converter that generates a second start pulse signal including a second pulse, a stop pulse signal generator that generates a stop pulse signal including a first stop pulse, and a first delay control signal generator that calculates a phase difference generates the first delay control signal.

20 Claims, 21 Drawing Sheets

(51) Int. Cl.
    *G01R 23/165*     (2006.01)
    *G01R 25/04*     (2006.01)
    *G01R 31/317*     (2006.01)
    *G01R 31/3183*     (2006.01)
    *G04F 10/00*     (2006.01)

(52) U.S. Cl.
    CPC ....... *G01R 25/04* (2013.01); *G01R 31/31713* (2013.01); *G01R 31/31715* (2013.01); *G01R 31/31724* (2013.01); *G01R 31/31725* (2013.01); *G01R 31/318328* (2013.01); *G04F 10/005* (2013.01)

(58) Field of Classification Search
    CPC ........ G01R 31/31715; G01R 31/31724; G01R 31/31725; G01R 31/318328; G04F 10/005
    USPC .................................................. 714/744, 731
    See application file for complete search history.

(56) References Cited

U.S. PATENT DOCUMENTS

| | | | |
|---|---|---|---|
| 6,609,077 B1 * | 8/2003 | Brown | G01R 31/31937 702/108 |
| 7,254,520 B2 | 8/2007 | Hashemian | |
| 7,447,289 B2 | 11/2008 | Uratani et al. | |
| 8,060,770 B2 | 11/2011 | Kuzmin et al. | |
| 8,674,244 B2 | 3/2014 | Kim et al. | |
| 8,952,838 B2 | 2/2015 | Waters et al. | |
| 11,105,879 B1 | 8/2021 | Cao et al. | |
| 2001/0013955 A1 * | 8/2001 | Tsukata | H04N 1/053 358/448 |
| 2003/0025626 A1 * | 2/2003 | McEwan | G01S 13/14 342/21 |
| 2006/0139736 A1 * | 6/2006 | Shimizu | H04B 10/66 725/100 |
| 2008/0063044 A1 * | 3/2008 | Iida | H03K 5/00006 375/238 |
| 2012/0179422 A1 * | 7/2012 | Webb, III | G01R 31/31725 702/187 |
| 2023/0333160 A1 * | 10/2023 | Kim | G04F 10/005 |

OTHER PUBLICATIONS

Flake et al., Time Synchronization and Controlled Asynchronization of Remote Analog Signals with Sub Nanosecond Resolution, Sep. 1, 2014, IEEE, pp. 1-5 (Year: 2014).*

* cited by examiner

FIG. 8

TABLE1

|  | Delay(ns) | tID(ns) | tMLC(ns) | tTF(ns) | tEG1(ns) |
|---|---|---|---|---|---|
| CH1 | 0 | 0.013 | 1.50 | 0.50 | 0.013 |
| CH2 | 0 | 0.052 | 1.65 | 0.55 | 0.052 |
| CH3 | 0 | 0.073 | 1.55 | 0.53 | 0.073 |
| CH4 | 0 | 0.009 | 1.60 | 0.51 | 0.009 |
| STOP-START1 |  |  |  |  | 0.060 |
| STOP-START2 |  |  |  |  | 0.021 |
| STOP-START3 |  |  |  |  | 0.000 |
| STOP-START4 |  |  |  |  | 0.064 |

TABLE2

|  | Delay(ns) | tID(ns) | tMLC(ns) | tTF(ns) | tEG1a(ns) |
|---|---|---|---|---|---|
| CH1 | 0.060 | 0.013 | 1.50 | 0.50 | 0.073 |
| CH2 | 0.020 | 0.052 | 1.65 | 0.55 | 0.072 |
| CH3 | 0.000 | 0.073 | 1.55 | 0.53 | 0.073 |
| CH4 | 0.060 | 0.009 | 1.60 | 0.51 | 0.069 |

FIG. 12

TABLE3

|  | Delay(ns) | tID(ns) | tMLC(ns) | tTF(ns) | tEG1a(ns) | tEG2a(ns) |
|---|---|---|---|---|---|---|
| CH1 | 0.060 | 0.013 | 1.50 | 0.50 | 0.073 | 3.073 |
| CH2 | 0.020 | 0.052 | 1.65 | 0.55 | 0.072 | 3.372 |
| CH3 | 0.000 | 0.073 | 1.55 | 0.53 | 0.073 | 3.173 |
| CH4 | 0.060 | 0.009 | 1.60 | 0.51 | 0.069 | 3.269 |
| STOP-START1 |  |  |  |  |  | 0.299 |
| STOP-START2 |  |  |  |  |  | 0.000 |
| STOP-START3 |  |  |  |  |  | 0.199 |
| STOP-START4 |  |  |  |  |  | 0.103 |

TABLE4

|  | Delay(ns) | tID(ns) | tMLC(ns) | tTF(ns) | tEG1b(ns) | tEG2b(ns) |
|---|---|---|---|---|---|---|
| CH1 | 0.350 | 0.013 | 1.50 | 0.50 | 0.363 | 3.363 |
| CH2 | 0.020 | 0.052 | 1.65 | 0.55 | 0.072 | 3.372 |
| CH3 | 0.190 | 0.073 | 1.55 | 0.53 | 0.263 | 3.363 |
| CH4 | 0.160 | 0.009 | 1.60 | 0.51 | 0.169 | 3.369 |

FIG. 15

TABLE5

| | Delay(ns) | tID(ns) | tMLC(ns) | tTF(ns) | tEG1b(ns) | tEG2b(ns) | tEG3b(ns) | tSIGa(ns) |
|---|---|---|---|---|---|---|---|---|
| CH1 | 0.350 | 0.013 | 1.50 | 0.50 | 0.363 | 3.363 | 4.363 | 2.363 |
| CH2 | 0.020 | 0.052 | 1.65 | 0.55 | 0.072 | 3.372 | 4.472 | 2.272 |
| CH3 | 0.190 | 0.073 | 1.55 | 0.53 | 0.263 | 3.363 | 4.423 | 2.343 |
| CH4 | 0.160 | 0.009 | 1.60 | 0.51 | 0.169 | 3.369 | 4.389 | 2.279 |
| STOP-START1 | | | | | | | 0.109 | |
| STOP-START2 | | | | | | | 0.000 | |
| STOP-START3 | | | | | | | 0.049 | |
| STOP-START4 | | | | | | | 0.083 | |

TABLE6

| | Delay(ns) | tID(ns) | tMLC(ns) | tTF(ns) | tEG1c(ns) | tEG2c(ns) | tEG3c(ns) | tSIGb(ns) |
|---|---|---|---|---|---|---|---|---|
| CH1 | 0.450 | 0.013 | 1.50 | 0.50 | 0.463 | 3.463 | 4.463 | 2.463 |
| CH2 | 0.020 | 0.052 | 1.65 | 0.55 | 0.072 | 3.372 | 4.472 | 2.272 |
| CH3 | 0.230 | 0.073 | 1.55 | 0.53 | 0.303 | 3.403 | 4.463 | 2.383 |
| CH4 | 0.240 | 0.009 | 1.60 | 0.51 | 0.249 | 3.449 | 4.469 | 2.359 |
| | | | | | | | | 0.191 |

FIG. 17

TABLE7

| | Delay(ns) | tID(ns) | tMLC(ns) | tTF(ns) | tEG1c(ns) | tEG2c(ns) | tEG3c(ns) | tSIGb(ns) |
|---|---|---|---|---|---|---|---|---|
| CH1 | 0.450 | 0.013 | 1.50 | 0.50 | 0.463 | 3.463 | 4.463 | 2.463 |
| CH2 | 0.020 | 0.052 | 1.65 | 0.55 | 0.072 | 3.372 | 4.472 | 2.272 |
| CH3 | 0.230 | 0.073 | 1.55 | 0.53 | 0.303 | 3.403 | 4.463 | 2.383 |
| CH4 | 0.240 | 0.009 | 1.60 | 0.51 | 0.249 | 3.449 | 4.469 | 2.359 |
| | | | | | | | | 0.191 |

TABLE8

| | Delay(ns) | tID(ns) | tMLC(ns) | tTF(ns) | tEG1d(ns) | tEG2d(ns) | tEG3d(ns) | tSIGc(ns) |
|---|---|---|---|---|---|---|---|---|
| CH1 | 0.255 | 0.013 | 1.50 | 0.50 | 0.268 | 3.268 | 4.268 | 2.268 |
| CH2 | 0.020 | 0.052 | 1.65 | 0.55 | 0.072 | 3.372 | 4.472 | 2.272 |
| CH3 | 0.115 | 0.073 | 1.55 | 0.53 | 0.188 | 3.288 | 4.348 | 2.268 |
| CH4 | 0.150 | 0.009 | 1.60 | 0.51 | 0.159 | 3.359 | 4.379 | 2.269 |
| | | | | | | | | 0.004 |

FAN-OUT BUFFER WITH SKEW CONTROL FUNCTION, OPERATING METHOD THEREOF, AND PROBE CARD INCLUDING THE SAME

CROSS-REFERENCE TO RELATED APPLICATION(S)

This application claims priority under 35 U.S.C. § 119 to Korean Patent Application No. 10-2022-0047103 filed on Apr. 15, 2022, in the Korean Intellectual Property Office, the disclosure of which is incorporated by reference herein in its entirety.

BACKGROUND

Embodiments of the present disclosure described herein relate to a fan-out buffer, and more particularly, relate to a fan-out buffer capable of simultaneously controlling a skew due to an internal circuit and a skew due to an external circuit, an operating method thereof, and a probe card including the same.

In a logic circuit, the term "fan-out" is used to describe the number of outputs of a single logic gate, which are used as inputs of any other logic gates.

That the fan-out is great means that the output of the single logic circuit is used as the inputs of many other logic gates. When the fan-out of the logic circuit is too great, the logic circuit is overloaded or the output signal of the logic circuit is not properly transferred to other logic circuits. To improve this issue, a buffer is connected between the logic circuit and the other logic circuits.

A probe card is an interface between an electronic test system and a semiconductor wafer. The probe card is mechanically docked to a prober and a tester and is electrically connected to the prober and the tester. The purpose of the probe card is to provide an electrical path between circuits on the semiconductor wafer and the electronic test system such that the circuits are tested and verified at a wafer level before the circuits are diced and packaged.

In general, the probe card includes a printed circuit board (PCB) and contact elements. The contact elements are formed of metal but are capable of being formed of any other materials.

The probe card is a device connecting the semiconductor wafer and the electronic test system to inspect the operation of the semiconductor wafer; when probe tips mounted on the probe card contact the semiconductor wafer, a fan-out buffer mounted on the probe card sends electrical signals to the semiconductor wafer and selects a defective semiconductor chip included in the semiconductor wafer depending on electrical signals returned from the semiconductor wafer.

SUMMARY

Embodiments of the present disclosure provide a fan-out buffer capable of simultaneously controlling a skew due to an internal circuit of the fan-out buffer and a skew due to an external circuit of the fan-out buffer, an operating method thereof, and a probe card including the fan-out buffer.

According to an embodiment, a fan-out buffer includes a first channel that includes a first delay circuit adjusting a first delay time of a calibration test signal depending on a first delay control signal, a second channel that includes a second delay circuit adjusting a second delay time of the calibration test signal depending on a second delay control signal, a first edge-to-pulse converter that detects a first edge included in a first time domain reflectometry (TDR) waveform of an output terminal of the first channel and generates a first start pulse signal including a first pulse, a second edge-to-pulse converter that detects a first edge included in a second TDR waveform of an output terminal of the second channel and generates a second start pulse signal including a second pulse, a stop pulse signal generator that generates a stop pulse signal including a first stop pulse by performing an AND operation on the first pulse and the second pulse, and a first delay control signal generator that calculates a phase difference between the first pulse and the first stop pulse and generates the first delay control signal by using a calculation result such that a skew between the first pulse and the second pulse is calibrated.

According to an embodiment, a probe card includes first and second probe tips, a fan-out buffer that includes a first channel including a first delay circuit adjusting a first delay time of a calibration test signal depending on a first delay control signal, and a second channel including a second delay circuit adjusting a second delay time of the calibration test signal depending on a second delay control signal, a first edge-to-pulse converter that detects a first edge included in a first time domain reflectometry (TDR) waveform of an output terminal of the first channel and generates a first start pulse signal including a first pulse, a second edge-to-pulse converter that detects a first edge included in a second TDR waveform of an output terminal of the second channel and generates a second start pulse signal including a second pulse, a stop pulse signal generator that generates a stop pulse signal including a first stop pulse by performing an AND operation on the first pulse and the second pulse, and a first delay control signal generator that calculates a phase difference between the first pulse and the first stop pulse and generates the first delay control signal by using a calculation result such that a skew between the first pulse and the second pulse is calibrated, a first transmission circuit that is connected between the first channel and the first probe tip, and a second transmission circuit that is connected between the second channel and the second probe tip.

According to an embodiment, an operating method of a fan-out buffer which includes a first channel including a first delay circuit configured to adjust a first delay time of a calibration test signal depending on a first delay control signal and a second channel including a second delay circuit configured to adjust a second delay time of the calibration test signal depending on a second delay control signal includes detecting an edge included in a first time domain reflectometry (TDR) waveform on an output terminal of the first channel to generate a first start pulse signal including a first pulse, detecting an edge included in a second TDR waveform on an output terminal of the second channel to generate a second start pulse signal including a second pulse, generating a stop pulse signal including a first stop pulse by performing an AND operation on the first pulse and the second pulse, and calculating a first phase difference between the first pulse and the first stop pulse and generating the first delay control signal by using a calculation result such that a skew between the first pulse and the second pulse is calibrated.

The method further includes calculating a second phase difference between the second pulse and the first stop pulse and generating the second delay control signal by using a calculation result such that the skew between the first pulse and the second pulse is calibrated. The first phase difference is calculated by using a first time-to-digital converter, and the second phase difference is calculated by using a second time-to-digital converter.

BRIEF DESCRIPTION OF THE FIGURES

The above and other objects and features of the present disclosure will become apparent by describing in detail embodiments thereof with reference to the accompanying drawings.

FIG. 8 is a diagram illustrating tables including delays of components before and after skew calibration for first edges, which is performed in a fan-out buffer of FIG. 1 according to example embodiments.

FIG. 12 is a diagram illustrating tables including delays of components before and after skew calibration for second edges, which is performed in a fan-out buffer of FIG. 1 according to example embodiments.

FIG. 15 is a diagram illustrating tables including delays of components before and after skew calibration for third edges, which is performed in a fan-out buffer of FIG. 1 according to example embodiments.

FIG. 17 is a diagram illustrating tables including delays of components before and after final skew calibration performed in a fan-out buffer of FIG. 1 according to example embodiments.

DETAILED DESCRIPTION

Figure 1:
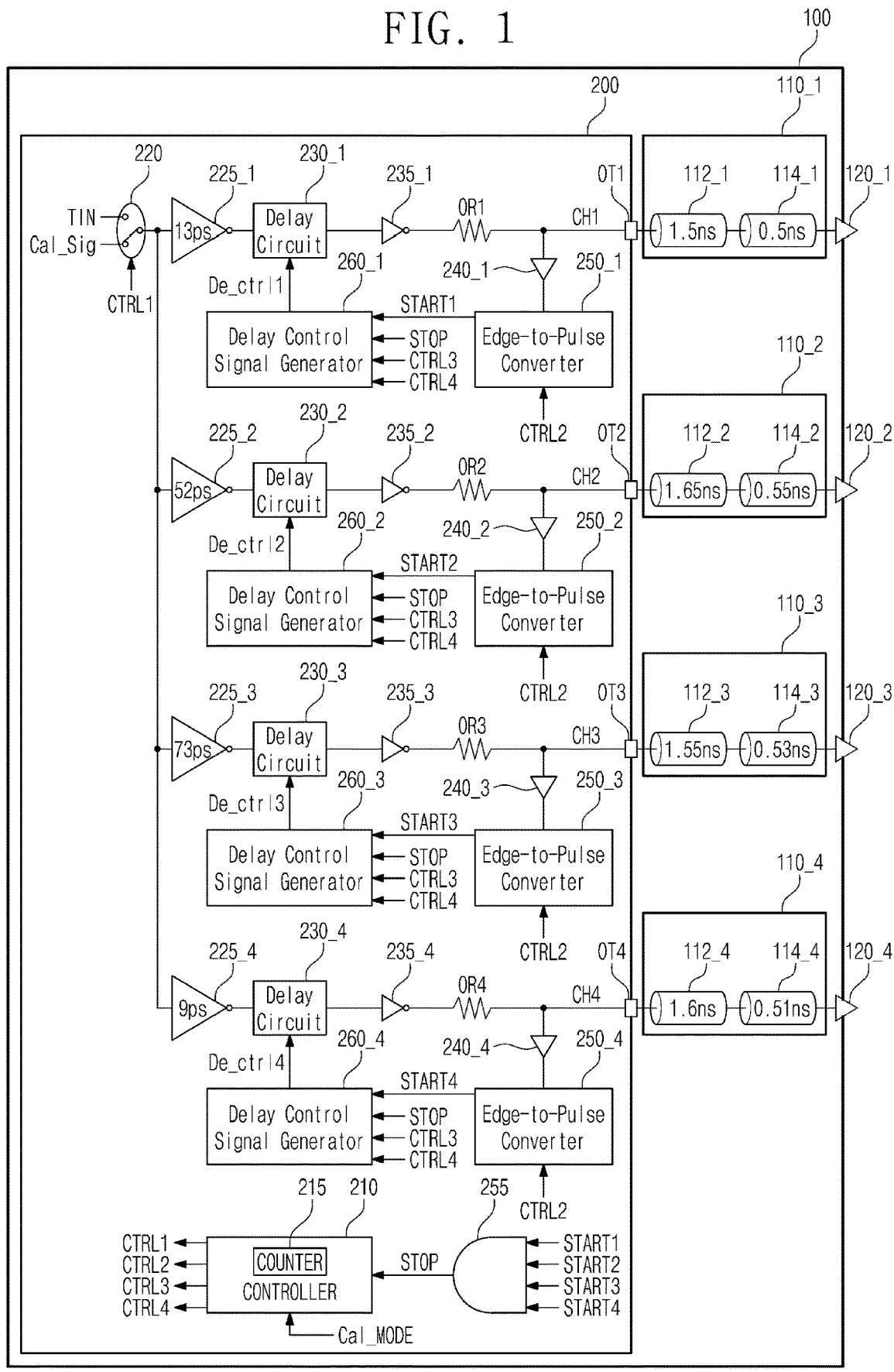
FIG. 1 is a circuit diagram of a probe card including a fan-out buffer according to an embodiment of the present disclosure.

FIG. 1 is a circuit diagram of a probe card including a fan-out buffer according to an embodiment of the present disclosure.

Referring to FIG. 1, a probe card 100 capable of testing a device under test DUT includes a fan-out buffer 200, first to fourth external circuits (alternatively referred to as "transmission lines" or "transmission circuits") 110_1, 110_2, 110_3, and 110_4, and first to fourth probe tips 120_1, 120_2, 120_3, and 120_4.

The DUT is termed equipment under test (EUT) or unit under test (UUT) and is a manufactured product on which testing is performed during a lifetime period as a part of functional testing and calibration checks that are being performed during or after the initial manufacturing process.

For example, in the electronics industry, the DUT refers to any electronic assembly under test, and electronic devices (e.g., mobile phones) coming out of the assembly line may be finally tested in the same manner that individual chips are previously tested.

In a semiconductor testing process, the DUT may be a die on a wafer or a resulting packaged part. The DUT may be tested by automatic or automated test equipment (ATE).

The fan-out buffer 200 that is also termed a fan-out buffer chip may measure electrical lengths of respective branch lines (e.g., respective branch lines respectively included in the first to fourth transmission circuits 110_1 to 110_4) by applying a time domain reflectometry (TDR) principle to a change of a signal (e.g., a signal transferred and reflected by an input calibration test signal Cal_Sig (e.g., a step signal)) observed at each of output terminals OT1 to OT4 of the fan-out buffer 200 and performing an inverse (or reverse) operation on an arrival time of a reflection waveform at each of the output terminals OT1 to OT4 and may calculate skews between the branch lines respectively connected to the output terminals OT1 to OT4 depending on a result of comparing the measured electrical lengths (e.g., delay times of the branch lines).

The fan-out buffer 200 may simultaneously control a skew due to internal circuits of the fan-out buffer 200 and a skew due to the first to fourth external circuits 110_1 to 110_4 by observing waveform change time points at the output terminals OT1 to OT4, calculating differences between signal delay times due to the internal circuits of the fan-out buffer 200 and signal delay times due to the first to fourth external circuits 110_1 to 110_4 of the fan-out buffer 200 depending on the observed results, and feeding back the calculated values to the inside of the fan-out buffer 200 such that the differences are controlled.

The fan-out buffer 200 includes a controller 210, a switch circuit 220, a plurality of channels CH1 to CH4, a plurality of buffers 240_1 to 240_4, a plurality of edge-to-pulse converters 250_1 to 250_4, a stop pulse signal generator 255, and a plurality of delay control signal generators 260_1 to 260_4.

The controller 210 generates a first control signal CTRL1 and a second control signal CTRL2 in response to a calibration mode control signal Cal_MODE. A counter 215 of the controller 210 counts an edge of each of pulses included in a stop pulse signal STOP output from the stop pulse signal generator 255 and outputs a count value indicating a pulse order of each of the pulses. The controller 210 further generates control signals CTRL3 and CTRL4 depending on the count value of the counter 215.

When the calibration mode control signal Cal_MODE indicates a normal mode, the switch circuit 220 transmits an input signal TIN to first input inverters 225_1 to 225_4 depending on the first control signal CTRL1 output from the controller 210, and the edge-to-pulse converters 250_1 to 250_4 are disabled depending on the second control signal CTRL2 output from the controller 210. For example, the input signal TIN may be a test signal, and the normal mode may be an operating mode of fan-outing and outputting the input signal TIN.

When the calibration mode control signal Cal_MODE indicates a calibration mode, the switch circuit 220 transmits the calibration test signal Cal_Sig to the first input inverters 225_1 to 225_4 depending on the first control signal CTRL1 output from the controller 210, and the edge-to-pulse converters 250_1 to 250_4 are enabled depending on the second control signal CTRL2 output from the controller 210.

For example, the calibration test signal Cal_Sig may be a step signal, and the calibration mode may be an operating mode of calibrating skews between the channels CH1 to CH4. After the operation in the calibration mode ends, the fan-out buffer 200 may return (or automatically return) to the normal mode from the calibration mode.

To distinguish the normal mode and the calibration mode, a separate pin receiving the calibration mode control signal Cal_MODE may be implemented at the fan-out buffer 200, a specific command applied to a signal input at the fan-out buffer 200 and directing to enter the calibration mode may be transmitted to the controller 210, or to enter the calibration mode may be automatically made when an operating voltage is supplied to the controller 210 or the fan-out buffer 200 and a given time passes (e.g., after a power up).

In the specification, each of the channels CH1, CH2, CH3, and CH4 means a transmission circuit including an input inverter, a delay circuit, an output inverter, and an output resistor.

The first channel CH1 includes a first input inverter 225_1, a first delay circuit 230_1, a first output inverter 235_1, and a first output resistor OR1, and a delay (alternatively referred to as a "delay time") of the first delay circuit 230_1 is calibrated by a first delay control signal De_ctrl1.

The second channel CH2 includes a second input inverter 225_2, a second delay circuit 230_2, a second output inverter 235_2, and a second output resistor OR2, and a delay of the second delay circuit 230_2 is calibrated by a second delay control signal De_ctrl2.

The third channel CH3 includes a third input inverter 225_3, a third delay circuit 230_3, a third output inverter 235_3, and a third output resistor OR3, and a delay of the third delay circuit 230_3 is calibrated by a third delay control signal De_ctrl3.

The fourth channel CH4 includes a fourth input inverter 225_4, a fourth delay circuit 230_4, a fourth output inverter 235_4, and a fourth output resistor OR4, and a delay of the fourth delay circuit 230_4 is calibrated by a fourth delay control signal De_ctrl4. According to an embodiment, each of the delay circuits 230_1 to 230_4 may include a plurality of delay elements (e.g., inverters) connected in series, and the delays of the delay circuits 230_1 to 230_4 are respectively calibrated by the delay control signals De_ctrl1 to De_ctrl4.

When each of the input inverters 225_1 to 225_4 has an intrinsic delay, it is assumed that the delay of the first channel CH1 (i.e., a total delay from the input terminal of the first input inverter 225_1 to the first output terminal OT1) is 13 picosecond (ps), the delay of the second channel CH2 (i.e., a total delay from the input terminal of the second input inverter 225_2 to the second output terminal OT2) is 52 ps, the delay of the third channel CH3 (i.e., a total delay from the input terminal of the third input inverter 225_3 to the third output terminal OT3) is 73 ps, and the delay of the fourth channel CH4 (i.e., a total delay from the input terminal of the fourth input inverter 225_4 to the fourth output terminal OT4) is 9 ps. Also, it is assumed that the delays of the delay circuits 230_1 to 230_4 are "0" before the calibration.

The delays 13 ps, 52 ps, 73 ps, and 9 ps are respectively marked within symbols of the input inverters 225_1 to 225_4, and for convenience, the description will be given under the condition that the delays of the channels CH1 to CH4 correspond to the delays of the input inverters 225_1 to 225_4.

The plurality of buffers 240_1 to 240_4 include input terminals connected to the output terminals OT1 to OT4 of the channels CH1 to CH4, receive and buffer signals of the output terminals OT1 to OT4 of the channels CH1 to CH4, and transmit the buffered signals to the edge-to-pulse converters 250_1 to 250_4.

Each of the first to fourth probe tips 120_1, 120_2, 120_3, and 120_4 may contact a corresponding circuit pattern of the DUT. For example, each of the first to fourth probe tips 120_1, 120_2, 120_3, and 120_4 may contact an internal circuit of a corresponding DUT.

Figure 2A:
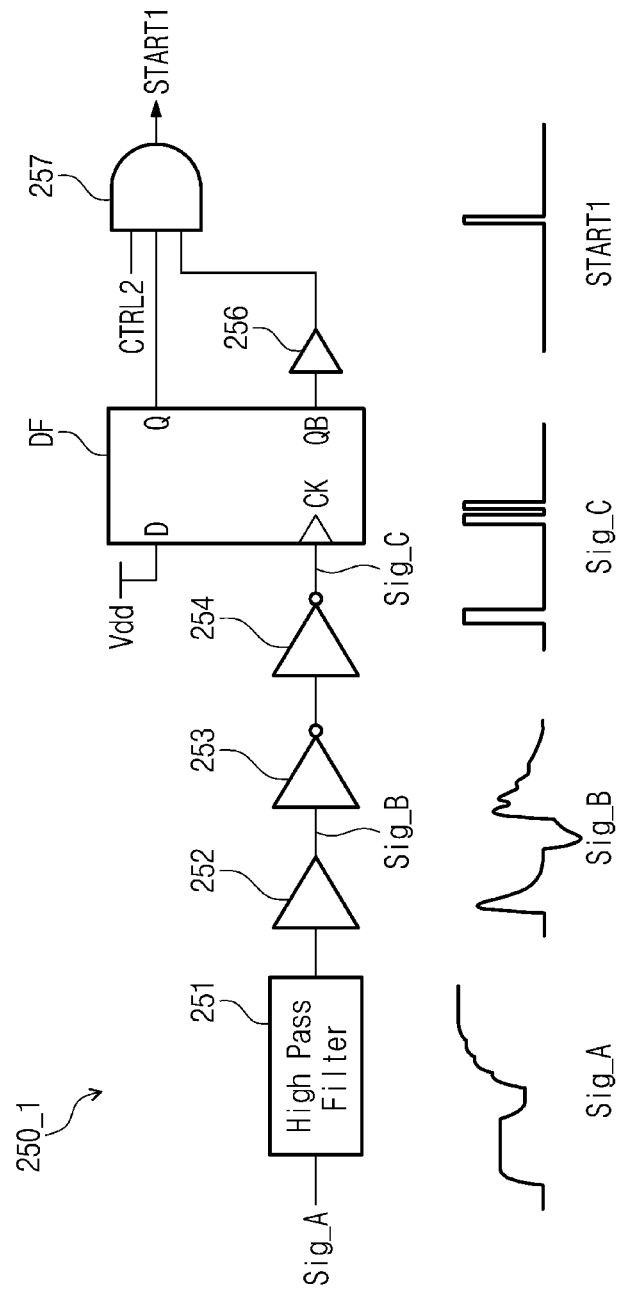
FIG. 2A is a circuit diagram of a first edge-to-pulse converter included in a fan-out buffer of FIG. 1 according to example embodiments.

FIG. 2A is a circuit diagram of a first edge-to-pulse converter included in a fan-out buffer of FIG. 1 according to example embodiments. Referring to FIGS. 1 and 2A, it is assumed that the edge-to-pulse converters 250_1 to 250_4 are implemented in the same structure and perform the same operations. Accordingly, the structure and the operation of the first edge-to-pulse converter 250_1 will be representatively described.

When a step signal is output from the output terminal OT1 of the first channel CH1, the step signal is transferred to the first transmission line 110_1 of the probe card 100 connected to the first channel CH1, because the first probe tip 120_1 of the first transmission line 110_1 of the probe card 100 is in an open state where the first probe tip 120_1 is not connected to the DUT (e.g., a wafer), a total reflection TDR profile (referred to as a "waveform") Sig_A is observed at the first channel CH1.

Because the TDR profile Sig_A is incapable of being used without modification for the purpose of measuring the delay of the first transmission line 110_1 by using the TDR profile Sig_A, each change time point of the TDR profile Sig_A should be converted into a pulse having an appropriate magnitude (or amplitude).

Accordingly, to calibrate a skew due to the delay of each of the first to fourth transmission lines 110_1 to 110_4 respectively connected to the channels CH1 to CH4 of the fan-out buffer 200 as well as a skew of the fan-out buffer 200 itself, the fan-out buffer 200 includes the edge-to-pulse converters 250_1 to 250_4 that convert TDR waveforms of the output terminals OT1 to OT4 into start pulse signals START1 to START4 such that the TDR waveforms are processed in logical circuits as well as time-to-digital converters TDC.

Figure 5:
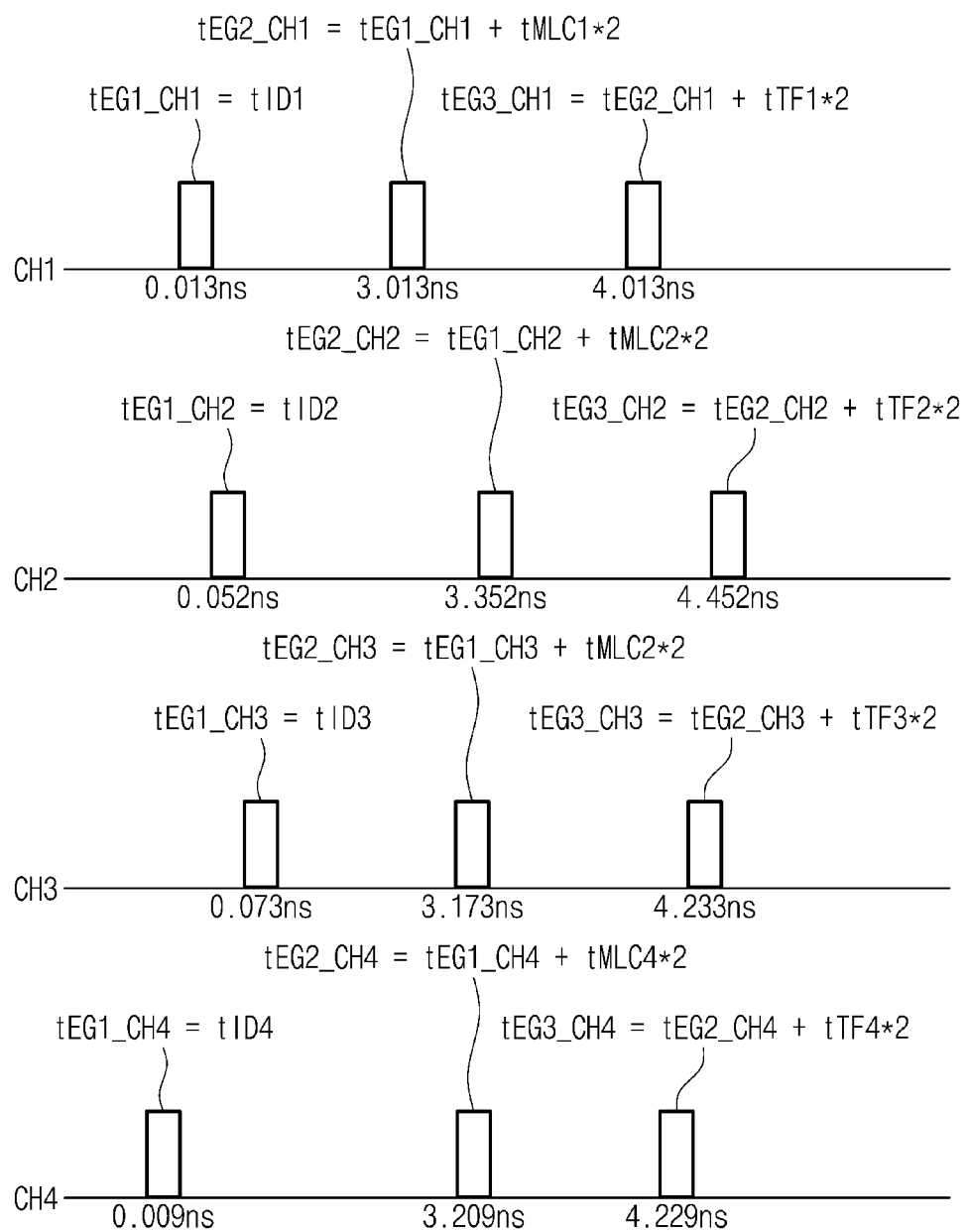
FIG. 5 is a timing diagram of output signals of edge-to-pulse converters included in a fan-out buffer of FIG. 1 according to example embodiments.
Figure 10:
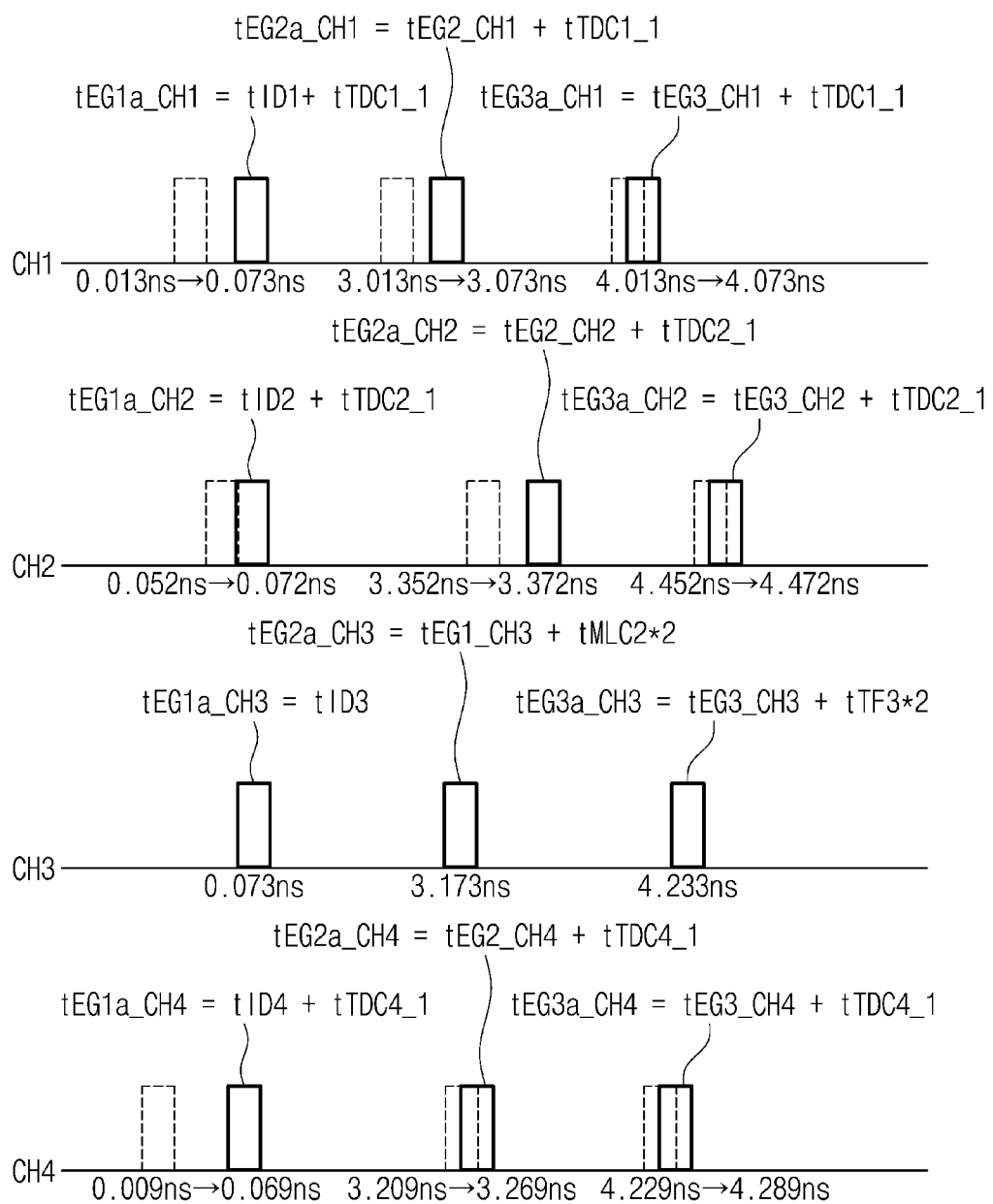
FIG. 10 is a diagram illustrating output signals of edge-to-pulse converters after skew calibration is performed on first edges, in a fan-out buffer of FIG. 1 according to example embodiments.
Figure 14:
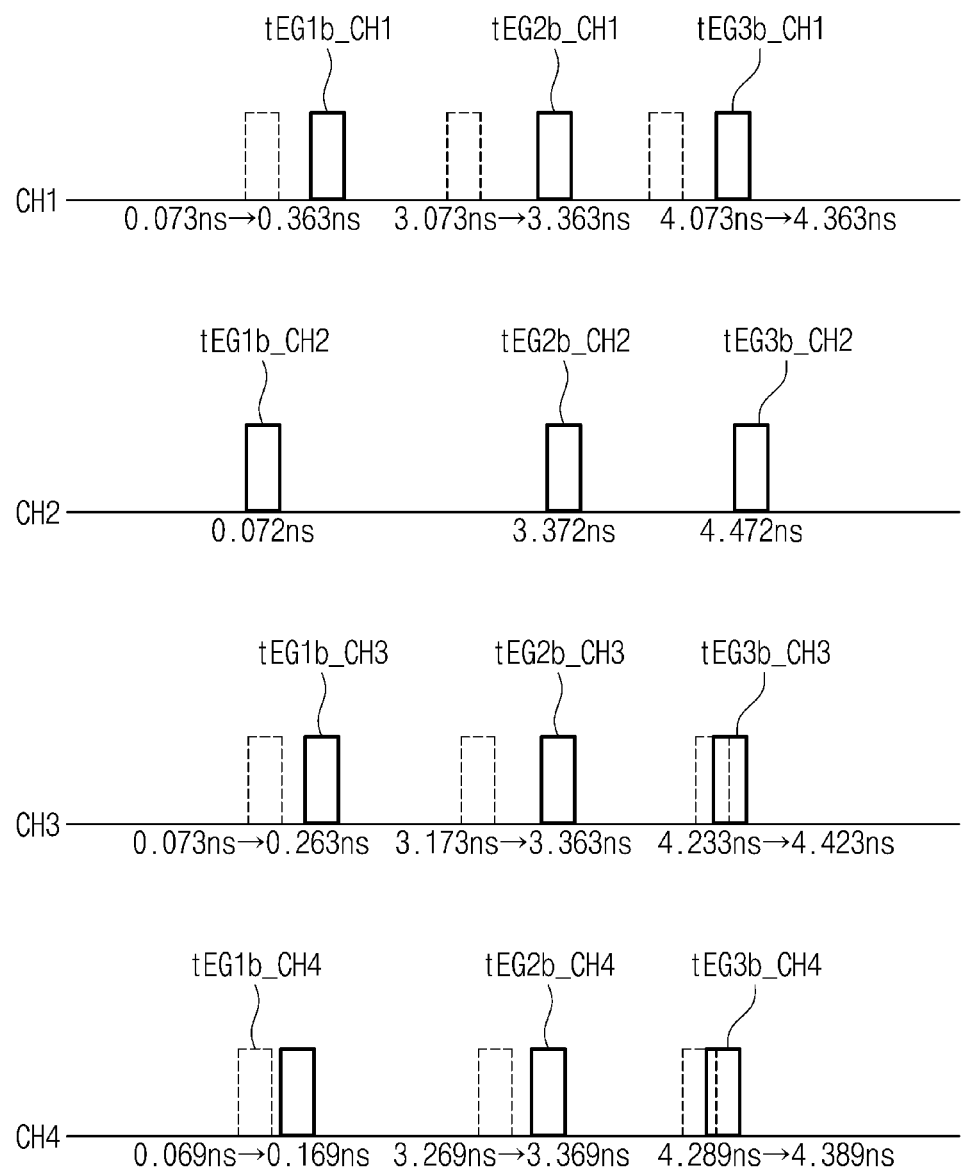
FIG. 14 is a timing diagram of output signals of edge-to-pulse converters after skew calibration is performed on second edges, in a fan-out buffer of FIG. 1 according to example embodiments.

The edge-to-pulse converters 250_1 to 250_4 detect edges (e.g., rising edges) of the TDR waveforms of the output terminals OT1 to OT4 of the channels CH1 to CH4 and generate the start pulse signals START1 to START4. Each of the start pulse signals START1 to START4 includes a plurality of pulses (or a k number of pulses), and k is a natural number of 2 or more during the skew calibration for the edges of the TDR waveform. As illustrated in FIGS. 5, 10, and 14, each of the start pulse signals START1 to START4 includes three pulses.

Referring to FIG. 2A, the first edge-to-pulse converter 250_1 includes a high pass filter 251, an amplifier 252, a first inverter 253, a second inverter 254, a D-flip-flop DF, a delay circuit 256, and an AND gate 257. The first and second inverters 253 and 254 constitute a buffer.

The high pass filter 251 receives the TDR profile Sig_A buffered by the first buffer 240_1, detects an edge included in the TDR profile Sig_A by performing high pass filtering on the TDR profile Sig_A, and generates an edge-detected TDR waveform.

The amplifier 252 receives and buffers an output signal of the high pass filter 251 and generates an edge-detected TDR waveform Sig_B.

The first inverter 253 inverts the edge-detected TDR waveform Sig_B, and the second inverter 254 inverts an output signal of the first inverter 253 and outputs an output signal Sig_C to a clock terminal CK of the D-flip-flop DF.

The D-flip-flop DF receives a voltage Vdd of a high level input at an input terminal D, latches the high level in response to the output signal Sig_C of the second inverter 254, and outputs an output signal Q as a latch result.

The delay circuit 256 delays an inversion output signal QB of the D-flip-flop DF as much as a given time.

Figure 2B:
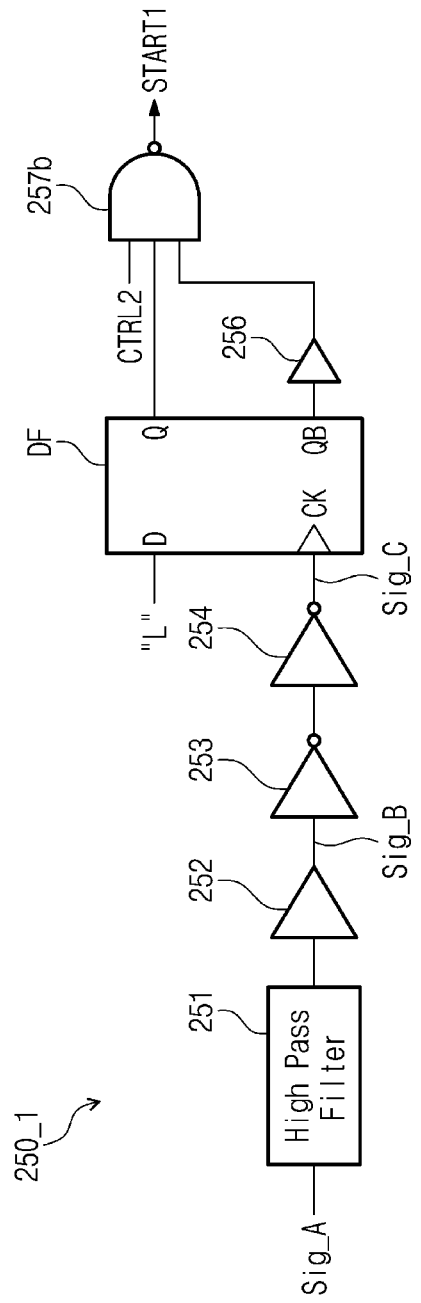
FIG. 2B is a circuit diagram illustrating another embodiment of a first edge-to-pulse converter included in a fan-out buffer of FIG. 1 according to example embodiments.

FIG. 2B is a circuit diagram illustrating another embodiment of a first edge-to-pulse converter included in a fan-out buffer of FIG. 1 according to example embodiments.

Referring to FIG. 2B, the AND gate 257 of FIG. 2A may be replaced with a NAND gate 257b.

The NAND gate 257b performs a NAND operation on the output signal Q and the output signal of the delay circuit 256 and generates the first start pulse signal START1.

When the second control signal CTRL2 is at the high level, the first edge-to-pulse converter 250_1 may generate the first start pulse signal START1; when the second control signal CTRL2 is at the low level, the first edge-to-pulse converter 250_1 may be disabled or may output a signal of the low level.

The stop pulse signal generator 255 generates the stop pulse signal STOP by performing an AND operation on pulses included in the start pulse signals START1 to START4 respectively output from the edge-to-pulse converters 250_1 to 250_4. The stop pulse signal STOP includes a plurality of stop pulses (or a k number of stop pulses).

The first delay control signal generator 260_1 generates the first delay control signal De_ctrl1 by using the first start pulse signal START1, the stop pulse signal STOP, the third control signal CTRL3, and the fourth control signal CTRL4 and outputs the first delay control signal De_ctrl1 to the first delay circuit 230_1. The first delay circuit 230_1 sets a delay in response to the first delay control signal De_ctrl1 (this being referred to as "calibration").

The second delay control signal generator 260_2 generates the second delay control signal De_ctrl2 by using the second start pulse signal START2, the stop pulse signal STOP, the third control signal CTRL3, and the fourth control signal CTRL4 and outputs the second delay control signal De_ctrl2 to the second delay circuit 230_2. The second delay circuit 230_2 sets a delay in response to the second delay control signal De_ctrl2.

The third delay control signal generator 260_3 generates the third delay control signal De_ctrl3 by using the third start pulse signal START3, the stop pulse signal STOP, the third control signal CTRL3, and the fourth control signal CTRL4 and outputs the third delay control signal De_ctrl3 to the third delay circuit 230_3. The third delay circuit 230_3 sets a delay in response to the third delay control signal De_ctrl3.

The fourth delay control signal generator 260_4 generates the fourth delay control signal De_ctrl4 by using the fourth start pulse signal START4, the stop pulse signal STOP, the third control signal CTRL3, and the fourth control signal CTRL4 and outputs the fourth delay control signal De_ctrl4 to the fourth delay circuit 230_4. The fourth delay circuit 230_4 sets a delay in response to the fourth delay control signal De_ctrl4.

Each of the delay control signals De_ctrl1 to De_ctrl4 may be a digital signal including a plurality of bits, and a value of each of the plurality of bits may be logic 1 (or data 1) or logic 0 (or data 0).

Figure 3A:
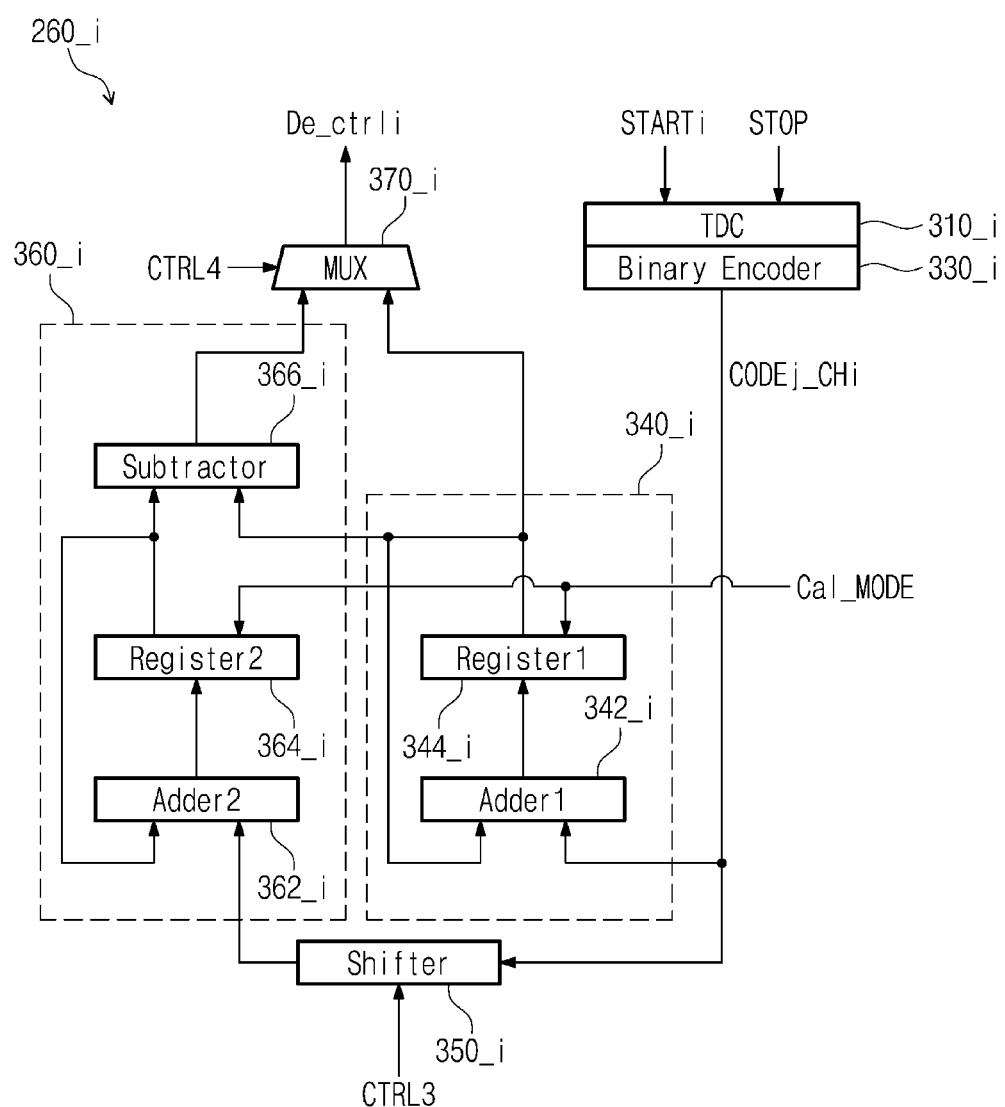
FIG. 3A is a diagram illustrating a delay control signal generator included in a fan-out buffer of FIG. 1 according to example embodiments.

FIG. 3A is a circuit diagram of a delay control signal generator included in a fan-out buffer of FIG. 1 according to example embodiments. Referring to FIGS. 1 and 3A, it is assumed that the delay control signal generators 260_1 to 260_4 are implemented in the same structure and perform the same operations. Accordingly, the structure and the operation of a first delay control signal generator 260_i (i being 1) will be representatively described.

The first delay control signal generator 260_i includes a time-to-digital converter (TDC) 310_i, a binary encoder 330_i, a first accumulator circuit 340_i, a right shifter 350_i, a second accumulator circuit 360_i, and a selection circuit 370_i. The selection circuit 370_i may be a multiplexer.

Figure 3B:
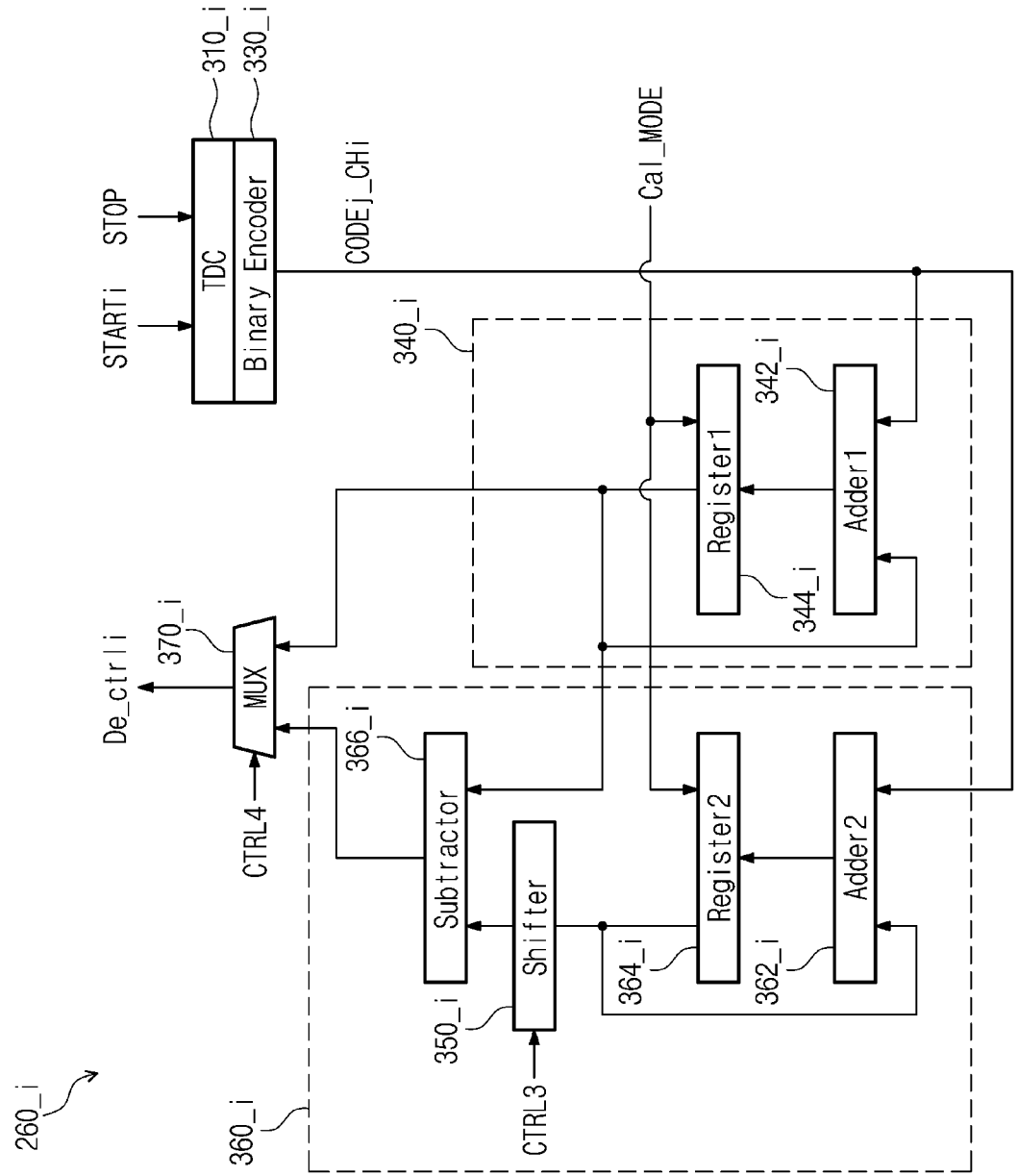
FIG. 3B is a circuit diagram illustrating another embodiment of a delay control signal generator included in a fan-out buffer of FIG. 1 according to example embodiments.
Figure 4:
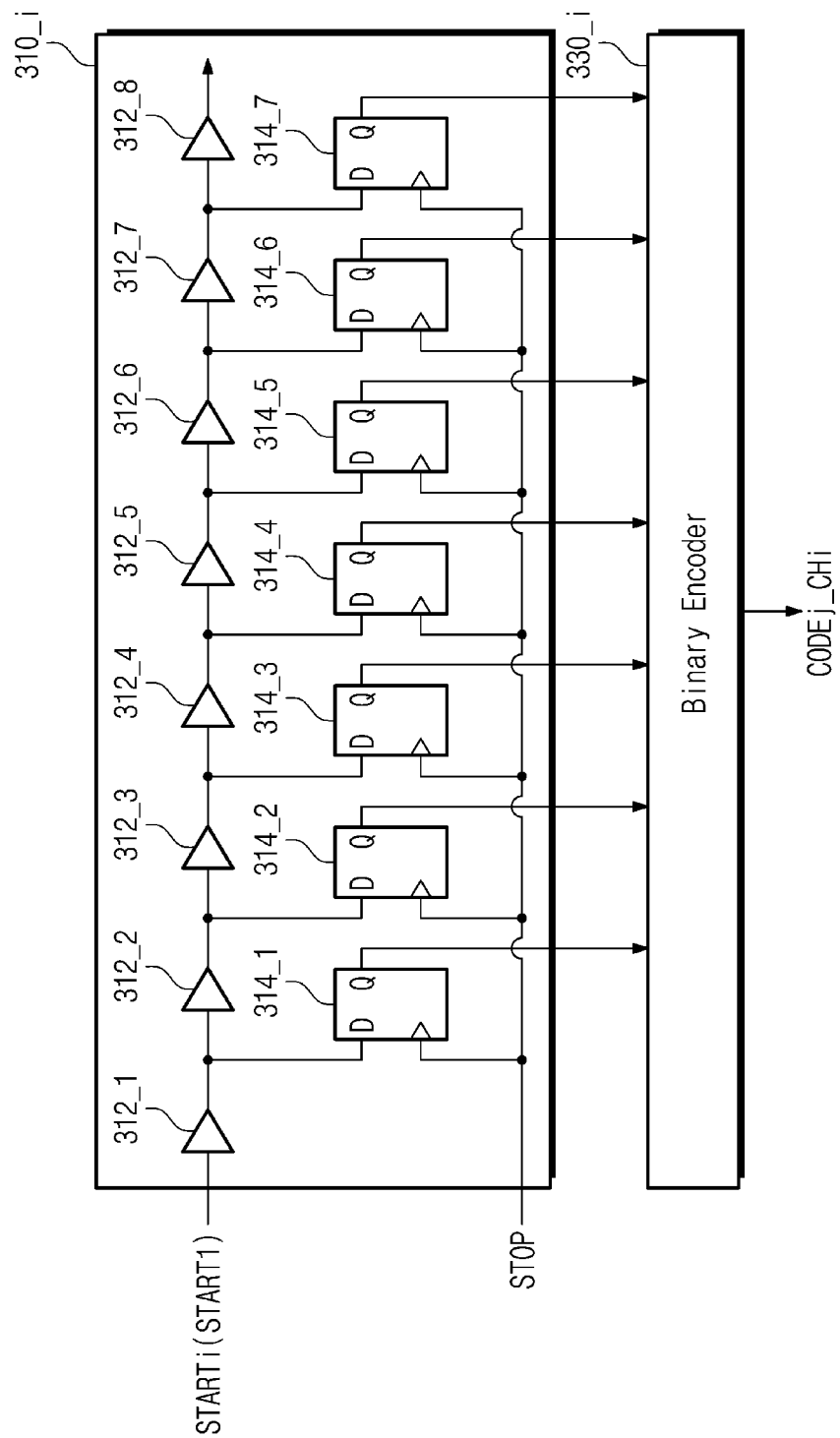
FIG. 4 is a circuit diagram illustrating a time-to-digital converter and a binary encoder included in a delay control signal generator of FIGS. 3A and 3B according to example embodiments.

FIG. 4 is a circuit diagram illustrating a time-to-digital converter and a binary encoder included in a delay control signal generator of FIGS. 3A and 3B according to example embodiments.

Referring to FIGS. 1, 3A, and 4, the TDC 310_i receives a start pulse signal STARTi (e.g., START1) and the stop pulse signal STOP and converts a time difference (alternatively referred to as a "phase difference" or a "timing difference") of the first start pulse signal START1 and the stop pulse signal STOP into digital signals.

The TDC 310_i includes delay elements 312_1 to 312_8 connected in series, and a plurality of D-flip-flops 314_1 to 314_7.

The first start pulse signal START1 is input to the first delay element 312_1 of the delay elements 312_1 to 312_8, output signals of the delay elements 312_1 to 312_7 are respectively input to input terminals D of the D-flip-flops 314_1 to 314_7, the stop pulse signal STOP is input to a clock terminal of each of the D-flip-flops 314_1 to 314_7, and output terminals Q of the D-flip-flops 314_1 to 314_7 are connected to an input of the binary encoder 330_i.

The binary encoder 330_i converts digital signals output from the TDC 310_i into a binary digital code CODEj_CHi. Herein, i and j are natural numbers.

The first accumulator circuit 340_i receives and accumulates the binary digital code CODEj_CHi output from the binary encoder 330_i. The first accumulator circuit 340_i includes a first adder 342_i and a first register 344_i. As illustrated in FIGS. 3A and 3B, when the calibration mode control signal Cal_MODE indicates the calibration mode, that is, when the fan-out buffer 200 enters the calibration mode, registers 344_i and 364_i are initialized.

The first adder 342_i adds the binary digital code CODEj_CHi output from the binary encoder 330_i and a binary digital code stored in the first register 344_i and again stores an addition result in the first register 344_i. An addition result is accumulated in the first register 344_i whenever the addition operation of the first adder 342_i is performed.

The binary digital code accumulated in the first register 344_i is transferred to a subtractor 366_i of the second accumulator circuit 360_i and a first input terminal of the selection circuit 370_i.

It is assumed that when a fan-output buffer is designed such that the stop pulse signal STOP including "k" stop pulses is generated for each of the channels CH1 to CH4, the counter 215 generates a count value having a first value (e.g., a value corresponding to "1") when the first stop pulse is generated, generates a count value having a second value (e.g., a value corresponding to "2") when the second stop pulse is generated, and generates a count value having a k-th value (e.g., a value corresponding to "k") when the k-th stop pulse is generated. In this case, k is a natural number of 3 or more.

When the counter 215 generates the second value (i.e., from the second edge), the controller 210 generates the third control signal CTRL3 for enabling the right shifter 350_i. The enabled right shifter 350_i shifts a binary digital code to the right by one bit, so as to be transferred to the second accumulator circuit 360_i.

The second accumulator circuit 360_i includes a second adder 362_i, a second register 364_i, and the subtractor 366_i.

The second adder 362_i adds a binary digital code output from the enabled right shifter 350_i and a binary digital code stored in the second register 364_i and again stores an addition result in the second register 364_i. An addition result is accumulated in the second register 364_i whenever the addition operation of the second adder 362_i is performed.

The subtractor 366_i subtracts the binary digital code stored in the second register 364_i from the binary digital code stored in the first register 344_i and outputs a subtraction result to a second input terminal of the selection circuit 370_i.

Depending on the fourth control signal CTRL4, the selection circuit 370_i outputs the first delay control signal De_ctrl1 corresponding to the binary digital code stored in the first register 344_i to the first delay circuit 230_1. For example, the selection circuit 370_i may output the first delay control signal De_ctrl1 corresponding to the binary digital code stored in the first register 344_i to the first delay circuit 230_1 in response to the fourth control signal CTRL4 having a low level. Afterwards, depending on the fourth control signal CTRL4, the selection circuit 370_i outputs the first delay control signal De_ctrl1 corresponding to the binary digital code stored in the subtractor 366_i to the first delay circuit 230_1. For example, the selection circuit 370_i outputs the first delay control signal De_ctrl1 corresponding to the binary digital code stored in the subtractor 366_i to the first delay circuit 230_1 in response to the fourth control signal CTRL4 having a high level.

FIG. 3B is a circuit diagram illustrating another embodiment of a delay control signal generator included in a fan-out buffer of FIG. 1 according to example embodiments.

As described with reference to FIG. 3A, the second accumulator circuit 360_i may perform the accumulation operation by using an output signal of the right shifter 350_i; as illustrated in FIG. 3B, the second accumulator circuit 360_i may accumulate the binary digital code CODEj_CHi by using the second adder 362_i and the second register 364_i without modification, and then, the right shifter 350_i may perform the shift right operation when the subtraction operation of the subtractor 366_i is performed. For example, the subtractor 366_i may subtract the binary digital code output from the right shifter 350_i from the binary digital code stored in the first register 344_i and may output a subtraction result to the second input terminal of the selection circuit 370_i.

Because the operation of the delay control signal generator 260_i illustrated in FIG. 3B may be sufficiently understood from the operation of the delay control signal generator 260_i illustrated in FIG. 3A, additional description associated with the operation of the delay control signal generator 260_i of FIG. 3B will be omitted to avoid redundancy.

FIG. 5 is a timing diagram of output signals of edge-to-pulse converters included in a fan-out buffer of FIG. 1 according to example embodiments.

With regard to the fan-out buffer 200 fanned out to the four channels CH1 to CH4 and the first to fourth transmission lines 110_1 to 110_4 disposed in the probe card 100, the process of calibrating skews between the channels CH1 to CH4 by using the edge-to-pulse converters 250_1 to 250_4 and time-to-digital converters (TDC) included in the delay control signal generators 260_1 to 260_4 will be described under the following assumption.

1. A delay of the first channel CH1 (marked as a delay of the first input inverter 225_1) is 13 ps, a characteristic impedance of a first circuit 112_1 of the first transmission line 110_1 is 50Ω, a delay of the first circuit 112_1 is 1.5 nanoseconds (ns), a characteristic impedance of a second circuit 114_1 of the first transmission line 110_1 is 15Ω, and a delay of the second circuit 114_1 is 0.5 ns;
2. A delay of the second channel CH2 (marked as a delay of the second input inverter 225_2) is 52 ps, a characteristic impedance of a first circuit 112_2 of the second transmission line 110_2 is 50Ω, a delay of the first circuit 112_2 is 1.65 ns, a characteristic impedance of a second circuit 114_2 of the second transmission line 110_2 is 15Ω, and a delay of the second circuit 114_2 is 0.55 ns;
3. A delay of the third channel CH3 (marked as a delay of the third input inverter 225_3) is 73 ps, a characteristic impedance of a first circuit 112_3 of the third transmission line 110_3 is 50Ω, a delay of the first circuit 112_3 is 1.55 ns, a characteristic impedance of a second circuit 114_3 of the third transmission line 110_3 is 15Ω, and a delay of the second circuit 114_3 is 0.53 ns; and
4. A delay of the fourth channel CH4 (marked as a delay of the fourth input inverter 225_4) is 9 ps, a characteristic impedance of a first circuit 112_4 of the fourth transmission line 110_4 is 50Ω, a delay of the first circuit 112_4 is 1.6 ns, a characteristic impedance of a second circuit 114_4 of the fourth transmission line 110_4 is 15Ω, and a delay of the second circuit 114_4 is 0.51 ns.

Figure 19:
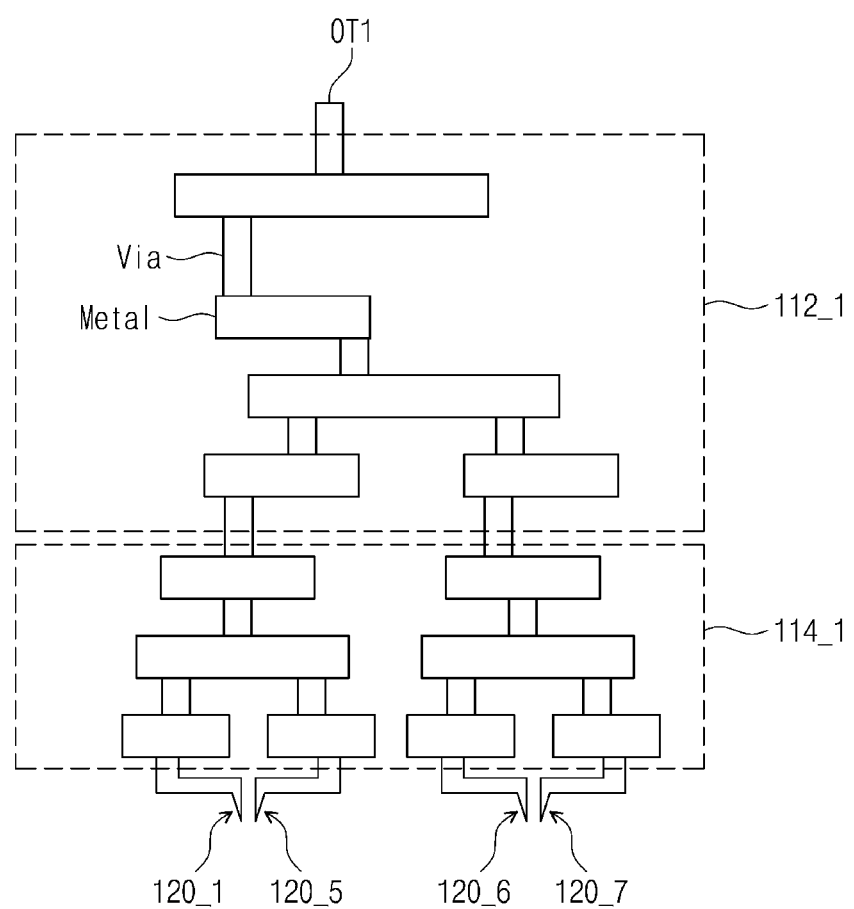
FIG. 19 is a cross-sectional view of a first transmission line having a ceramic branch structure and a thin film branch structure according to example embodiments.

FIG. 19 is a cross-sectional view of a first transmission line having a ceramic branch structure and a thin film branch structure according to example embodiments. Referring to FIGS. 1 and 19, it is assumed that each of the first circuits 112_1, 112_2, 112_3, and 112_4 is disposed within a first material (e.g., a multi-layer ceramic substrate) and includes metal lines and vias for signal branch. Also, it is assumed that each of the second circuits 114_1, 114_2, 114_3, and 114_4 is disposed within a second material (e.g., a thin film substrate) and includes metal lines and vias for signal branch. For example, a thickness of the thin film substrate is smaller than a thickness of the multi-layer ceramic substrate. Referring to FIGS. 1 and 19, a first probe tip 120_1 of FIG. 19 may correspond to the first probe tip 120_1 of FIG. 1 and probe tips 120_5 to 120_7 of FIG. 19 may correspond to probe tips 120_5 to 120_7 of FIG. 1 (not shown) respectively connected to transmission lines 110_5 to 110_7 (not shown) and the first output terminal OT1.

For convenience of description, a delay time of each circuit that is not mentioned in the above examples is not considered.

When the mode of the fan-out buffer 200 is changed from the normal mode to the calibration mode for channel skew calibration, the controller 210 generates the first control signal CTRL1 depending on the calibration mode control signal Cal_MODE, and thus, the switch circuit 220 transfers the calibration test signal Cal_Sig to each of the input inverters 225_1 to 225_4 in response to the first control signal CTRL1.

In the calibration mode, after the calibration test signal Cal_Sig is supplied to each of the four channels CH1 to CH4, the signals Sig_C are respectively generated in the edge-to-pulse converters 250_1 to 250_4 as illustrated in FIG. 5.

Referring to FIG. 5, it is assumed that, in terms of a detection time (or a pulse generation timing), the start pulse signals START1 to START4 include three pulses tEG1_CH1, tEG2_CH1, and tEG3_CH1, tEG1_CH2, tEG2_CH2, and tEG3_CH2, tEG1_CH3, tEG2_CH3, and tEG3_CH3, and tEG1_CH4, tEG2_CH4, and tEG3_CH4, respectively. Below, the description will be given based on the generation time point under the condition that a pulse is termed an edge.

For example, the first edge tEG1_CH1 (=0.013 ns) of the first channel CH1 is an internal delay tID1 of the first input inverter 225_1, and the second edge tEG2_CH1 (=3.013 ns) is tEG1_CH1 (=0.013 ns)+tMLC1*2 (=1.5*2=3.0 ns) because the signal passing through the first input inverter 225_1 is reflected from the end of the first circuit 112_1 of the first transmission line 110_1, and the third edge tEG3_CH1 (=4.013 ns) is tEG2_CH1 (=3.013 ns)+tTF1*2 (=0.5*2=1.0 ns) because the signal passing through the first input inverter 225_1 and the first circuit 112_1 of the first transmission line 110_1 is reflected from the end of the second circuit 114_1.

As in the above principle in which a pulse is generated at each of the edges tEG1_CH1, tEG2_CH1, and tEG3_CH1 of the first start pulse signal START1 for the first channel CH1, a pulse is generated at each of edges tEG1_CH2, tEG2_CH2, and tEG3_CH2 of the second start pulse signal START2 for the second channel CH2, a pulse is generated at each of edges tEG1_CH3, tEG2_CH3, and tEG3_CH3 of the third start pulse signal START3 for the third channel CH3, and a pulse is generated at each of edges tEG1_CH4, tEG2_CH4, and tEG3_CH4 of the fourth start pulse signal START4 for the fourth channel CH4.

Because three edges tEG1_CH1, tEG2_CH1, and tEG3_CH1, tEG1_CH2, tEG2_CH2, and tEG3_CH2, tEG1_CH3, tEG2_CH3, and tEG3_CH3, and tEG1_CH4, tEG2_CH4, and tEG3_CH4 are included for respective start pulse signals START1 to START4, during a first skew calibration operation in the calibration mode, the fan-out buffer 200 performs the skew calibration by using the first edges tEG1_CH1, tEG1_CH2, tEG1_CH3, and tEG1_CH4 of the start pulse signals START1 to START4 for respective channels CH1 to CH4.

During a second skew calibration operation in the calibration mode, the fan-out buffer 200 performs skew calibration by using the second edges tEG2_CH1, tEG2_CH2, tEG2_CH3, and tEG2_CH4 of the start pulse signals START1 to START4 for respective channels CH1 to CH4.

During a third skew calibration operation in the calibration mode, the fan-out buffer 200 performs skew calibration by using the third edges tEG3_CH1, tEG3_CH2, tEG3_CH3, and tEG3_CH4 of the start pulse signals START1 to START4 for respective channels CH1 to CH4.

After the third skew calibration operation in the calibration mode is completed, the fan-out buffer 200 additionally performs skew calibration once more.

Figure 6:
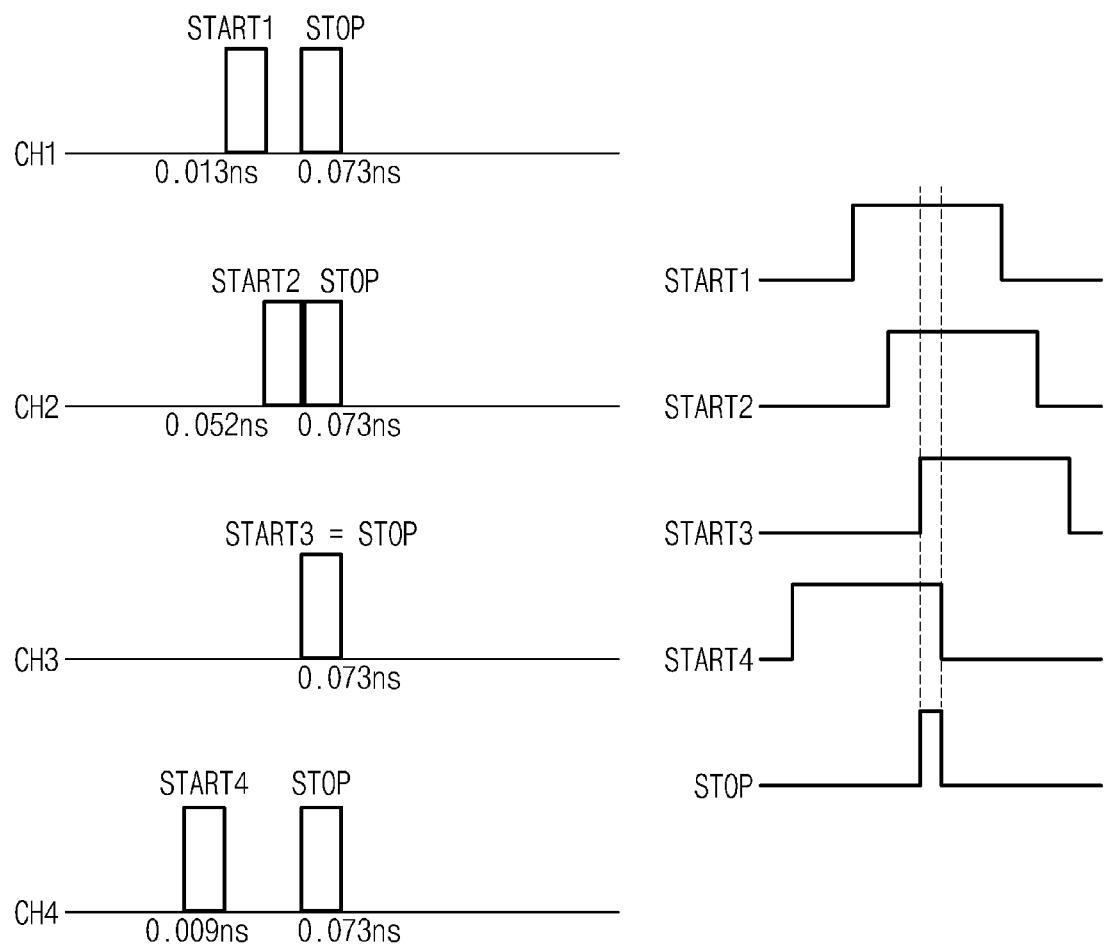
FIG. 6 is a timing diagram of a first edge of a start pulse signal of each channel and a stop pulse signal, in a fan-out buffer of FIG. 1 according to example embodiments.

FIG. 6 is a timing diagram of a first edge of a start pulse signal of each channel and a stop pulse signal, in a fan-out buffer of FIG. 1 according to example embodiments.

Referring to FIGS. 1, 5, and 6, the stop pulse signal generator 255 that is implemented with an AND gate selects the first edge tEG1_CH3 of the third start pulse signal START3 being the slowest from among the first edges tEG1_CH1, tEG1_CH2, tEG1_CH3, and tEG1_CH4 as the stop pulse signal STOP. In this case, the first edges tEG1_CH1, tEG1_CH2, tEG1_CH3 and tEG1_CH4 may be selected by the edge-to-pulse converters 250_1 to 250_4. In FIGS. 5 and 6, to make the expression of each pulse easy, a width of each pulse is illustrated to be narrow, but the mechanism in which the stop pulse signal STOP including the stop pulse is generated by using the AND gate 255 may be understood.

Figure 7:
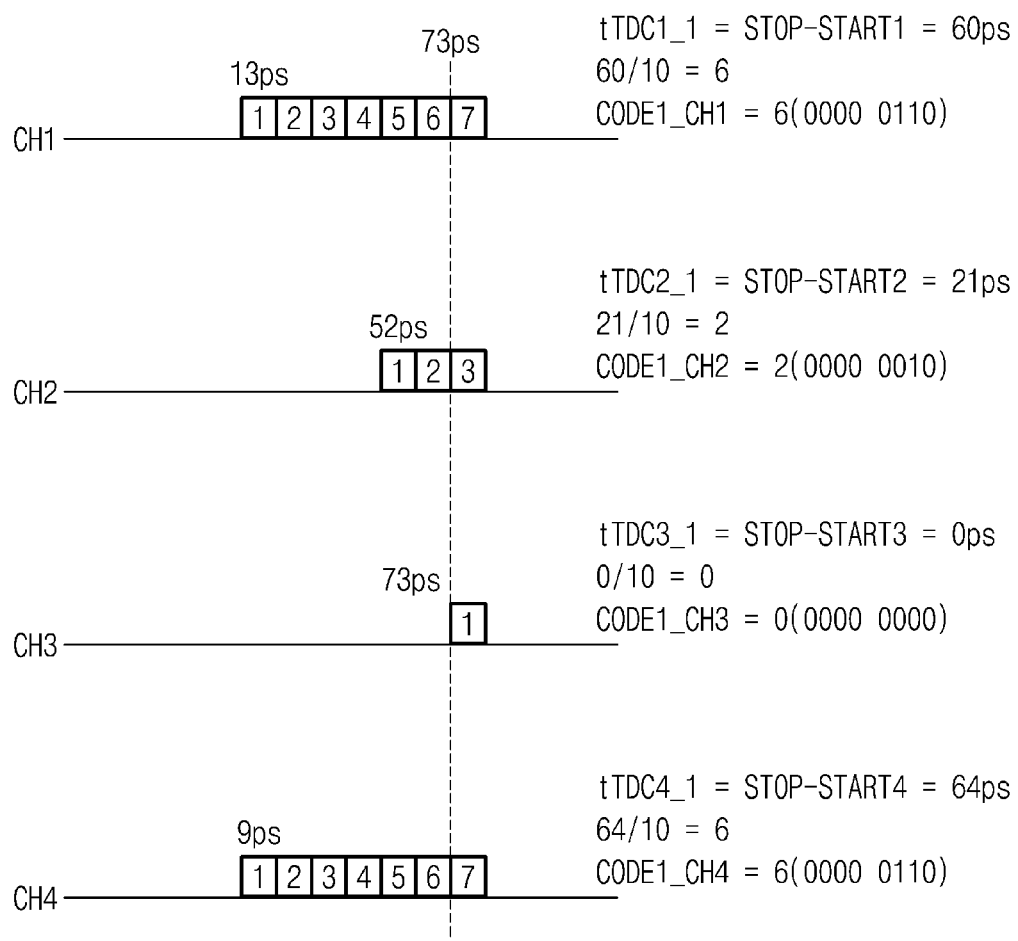
FIG. 7 is a diagram illustrating an embodiment of digital signals output from a time-to-digital converter included in each delay control signal generator and a binary digital code output from a binary encoder, in a fan-out buffer of FIG. 1 according to example embodiments.

FIG. 7 is a diagram illustrating an embodiment of digital signals output from a time-to-digital converter (TDC) included in each delay control signal generator and a binary digital code output from a binary encoder, in a fan-out buffer of FIG. 1 according to example embodiments.

Referring to FIGS. 3A, 4, 6, and 7, the TDCs 310_1, 310_2, 310_3, and 310_4 of the delay control signal generators 260_1 to 260_4 convert time delay differences between pulses included in the start pulse signals START1 to START4 and the stop pulse included in the stop pulse signal STOP into digital signals, and each of the binary encoders 330_1, 330_2, 330_3, and 330_4 of the delay control signal generators 260_1 to 260_4 convert the corresponding digital signal into the binary digital code CODEj_CHi.

It is assumed that the resolution of the TDCs 310_1, 310_2, 310_3, and 310_4 of the delay control signal generators 260_1 to 260_4 is 10 ps. As illustrated in FIG. 4, it is assumed that the delay of the delay elements 312_1 to 312_8 is 10 ps.

Referring to FIGS. 5 and 6, because a time difference tTDC1_1 of the first channel CH1 between the first edge tEG1_CH1 (=13 ps) of the first start pulse signal START1 and the edge tEG1_CH3 (=73 ps) of the stop pulse signal STOP is 60 ps and the resolution of the first TDC 310_1 of the first delay control signal generator 260_1 is 10 ps, the first TDC 310_1 outputs digital signals corresponding to $6_{10}$, and the first binary encoder 330_1 converts the digital signals corresponding to $6_{10}$ into the binary digital code CODE1_CH1 (=$6_{10}$=0000 0110).

The binary digital code CODE1_CH1 (=0000 0110) is transferred to the first adder 342_1; assuming that "0000 0000" is present in the first register 344_1, the binary digital code CODE1_CH1 (=0000 0110) is stored in the first register 344_1.

The selection circuit 370_1 transfers the first delay control signal De_ctrl1 corresponding to the binary digital code CODE1_CH1 (=0000 0110) stored in the first register 344_1 to the first delay circuit 230_1 depending on the fourth control signal CTRL4. Accordingly, the delay of the first delay circuit 230_1 is set to 60 ps.

Referring to FIGS. 5 and 6, because a time difference tTDC2_1 of the second channel CH2 between the first edge tEG1_CH2 (=52 ps) of the second start pulse signal START2 and the edge tEG1_CH3 (=73 ps) of the stop pulse signal STOP is 21 ps and the resolution of the second TDC 310_2 of the second delay control signal generator 260_2 is 10 ps, the second TDC 310_2 outputs digital signals corresponding to $2_{10}$, and the second binary encoder 330_2 of the second delay control signal generator 260_2 converts the digital signals corresponding to $2_{10}$ into the binary digital code CODE1_CH2 (=0000 0010).

The binary digital code CODE1_CH2 (=0000 0010) is transferred to the first adder 342_2 of the second delay control signal generator 260_2; assuming that "0000 0000" is present in the first register 344_2 of the second delay control signal generator 260_2, the binary digital code CODE1_CH2 (=0000 0010) is stored in the first register 344_2.

The selection circuit 370_2 of the second delay control signal generator 260_2 transfers the second delay control signal De_ctrl2 corresponding to the binary digital code CODE1_CH2 (=0000 0010) stored in the first register 344_2 of the second delay control signal generator 260_2 to the second delay circuit 230_2 depending on the fourth control signal CTRL4. Accordingly, the delay of the second delay circuit 230_2 is set to 20 ps.

Referring to FIGS. 5 and 6, because the time difference tTDC3_1 of the third channel CH3 between the first edge tEG1_CH3 (=73 ps) of the third start pulse signal START3 and the edge tEG1_CH3 (=73 ps) of the stop pulse signal STOP is 0 ps and the resolution of the third TDC 310_3 of the third delay control signal generator 260_3 is 10 ps, the third TDC 310_3 outputs digital signals corresponding to Oio, and the third binary encoder 330_3 of the third delay control signal generator 260_3 converts the digital signals corresponding to $0_{10}$ into the binary digital code CODE1_CH3 (=0000 0000).

The binary digital code CODE1_CH3 (=0000 0000) is transferred to the first adder 342_3 of the third delay control signal generator 260_3; assuming that "0000 0000" is present in the first register 344_3 of the third delay control signal generator 260_3, the binary digital code CODE1_CH3 (=0000 0000) is stored in the first register 344_3.

The selection circuit 370_3 of the third delay control signal generator 260_3 transfers the third delay control signal De_ctrl3 corresponding to the binary digital code CODE1_CH3 (=0000 0000) stored in the first register 344_3 of the third delay control signal generator 260_3 to the third delay circuit 230_3 depending on the fourth control signal CTRL4. Accordingly, the delay of the third delay circuit 230_3 is set to "0".

Referring to FIGS. 5 and 6, because the time difference tTDC4_1 of the fourth channel CH4 between the first edge tEG1_CH4 (=9 ps) of the fourth start pulse signal START4 and the edge tEG1_CH3 (=73 ps) of the stop pulse signal STOP is 64 ps and the resolution of the fourth TDC 310_4 of the fourth delay control signal generator 260_4 is 10 ps, the fourth TDC 310_4 outputs digital signals corresponding to $6_{10}$, and the fourth binary encoder 330_4 of the fourth delay control signal generator 260_4 converts the digital signals corresponding to $6_{10}$ into the binary digital code CODE1_CH4 (=0000 0110).

The binary digital code CODE1_CH4 (=0000 0110) is transferred to the first adder 342_4 of the fourth delay control signal generator 260_4; assuming that "0000 0000" is present in the first register 344_4 of the fourth delay control signal generator 260_4, the binary digital code CODE1_CH4 (=0000 0110) is stored in the first register 344_4.

The selection circuit 370_4 of the fourth delay control signal generator 260_4 transfers the fourth delay control signal De_ctrl4 corresponding to the binary digital code CODE1_CH4 (=0000 0110) stored in the first register 344_4 of the fourth delay control signal generator 260_4 to the fourth delay circuit 230_4 depending on the fourth control signal CTRL4. Accordingly, the delay of the fourth delay circuit 230_4 is set to 60 ps.

FIG. 8 is a diagram illustrating tables including delays of components before and after skew calibration for first edges, which is performed in a fan-out buffer of FIG. 1 according to example embodiments.

A first table TABLE1 of FIG. 8 shows delays of components before skew calibration is performed on the first edges tEG1_CH1, tEG1_CH2, tEG1_CH3, and tEG1_CH4 of the start pulse signals START1 to START4 respectively associated with the channels CH1 to CH4 of the fan-out buffer 200.

In the first table TABLE1, tMLC represents delays of the first circuits 112_1 to 112_4 of the first to fourth transmission lines 110_1 to 110_4, tTF represents delays of the second circuits 114_1 to 114_4 of the first to fourth transmission lines 110_1 to 110_4, tEG1 represents delays of the first edges tEG1_CH1, tEG1_CH2, tEG1_CH3, and tEG1_CH4 of the start pulse signals START1 to START4, and Delay represents delays of the delay circuits 230_1 to 230_4, and it is assumed that the initial delay of each of the delay circuits 230_1 to 230_4 is zero.

A second table TABLE2 of FIG. 8 shows delays of components after skew calibration is performed on the first edges tEG1_CH1, tEG1_CH2, tEG1_CH3, and tEG1_CH4 of the start pulse signals START1 to START4 respectively associated with the channels CH1 to CH4 of the fan-out buffer 200.

In the second table TABLE2 of FIG. 8, the delays associated with the channels CH1 to CH4 represent delays that are set to the delay circuits 230_1 to 230_4 after the skew calibration is performed on the first edges tEG1_CHL tEG1_CH2, tEG1_CH3, and tEG1_CH4 in each of the channels CH1 to CH4. A tEG1a is a sum of Delay and tID.

Figure 9:
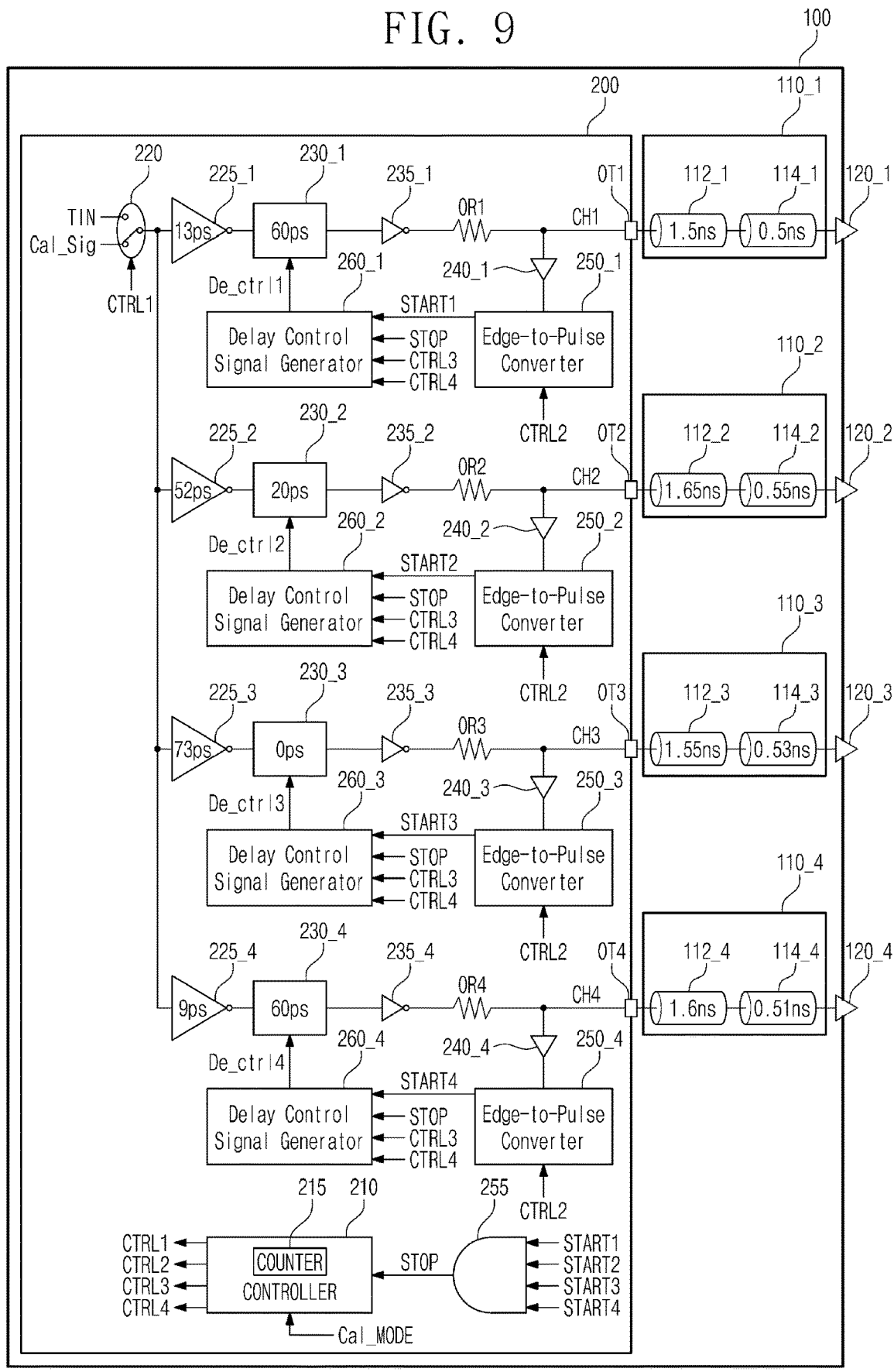
FIG. 9 is a diagram illustrating delays of delay circuits after skew calibration is performed on first edges, in a fan-out buffer of FIG. 1 according to example embodiments.

FIG. 9 is a diagram illustrating delays of delay circuits after skew calibration is performed on first edges, in a fan-out buffer of FIG. 1 according to example embodiments.

Referring to FIGS. 8 and 9, the delay of the first delay circuit 230_1 is set to 60 ps depending on the first delay control signal De_ctrl1 to which the time difference tTDC1_1 is applied, the delay of the second delay circuit 230_2 is set to 20 ps depending on the second delay control signal De_ctrl2 in which the time difference tTDC2_1 is applied, the delay of the third delay circuit 230_3 is set to 0 ps depending on the third delay control signal De_ctrl3 in which the time difference tTDC3_1 is applied, and the delay of the fourth delay circuit 230_4 is set to 60 ps depending on the fourth delay control signal De_ctrl4 to which the time difference tTDC4_1 is applied.

FIG. 10 is a diagram illustrating output signals of edge-to-pulse converters after skew calibration is performed on first edges, in a fan-out buffer of FIG. 1 according to example embodiments.

Referring to FIGS. 8 to 10, in the calibration mode, the calibration test signal Cal_Sig is transferred to the respective channels CH1 to CH4 through the switch circuit 220.

Edges corresponding to pulses included in the edge-to-pulse converters 250_1 to 250_4 are illustrated in FIG. 10.

When each of the edges tEG1_CH1, tEG2_CH1, and tEG3_CH1 of the first start pulse signal START1 illustrated in FIG. 5 is delayed by the time difference tTDC1_1 (=60 ps), edges tEG1a_CH1, tEG2a_CH1, and tEG3a_CH1 of the first start pulse signal START1 are formed as illustrated in FIG. 10.

When each of the edges tEG1_CH2, tEG2_CH2, and tEG3_CH2 of the second start pulse signal START2 illustrated in FIG. 5 is delayed by the time difference tTDC2_1 (=20 ps), edges tEG1a_CH2, tEG2a_CH2, and tEG3a_CH2 of the second start pulse signal START2 are formed as illustrated in FIG. 10.

Because the time difference tTDC3_1 is 0 ps, the edges tEG1a_CH3, tEG2a_CH3, and tEG3a_CH3 of the third start pulse signal START3 illustrated in FIG. 10 are identical to the edges tEG1_CH3, tEG2_CH3, and tEG3_CH3 of the third start pulse signal START3 illustrated in FIG. 5.

When each of the edges tEG1_CH4, tEG2_CH4, and tEG3_CH4 of the fourth start pulse signal START4 illustrated in FIG. 5 is delayed by a time difference tTDC4_1 (=60 ps), edges tEG1a_CH4, tEG2a_CH4, and tEG3a_CH4 of the fourth start pulse signal START4 are formed as illustrated in FIG. 10.

Figure 11:
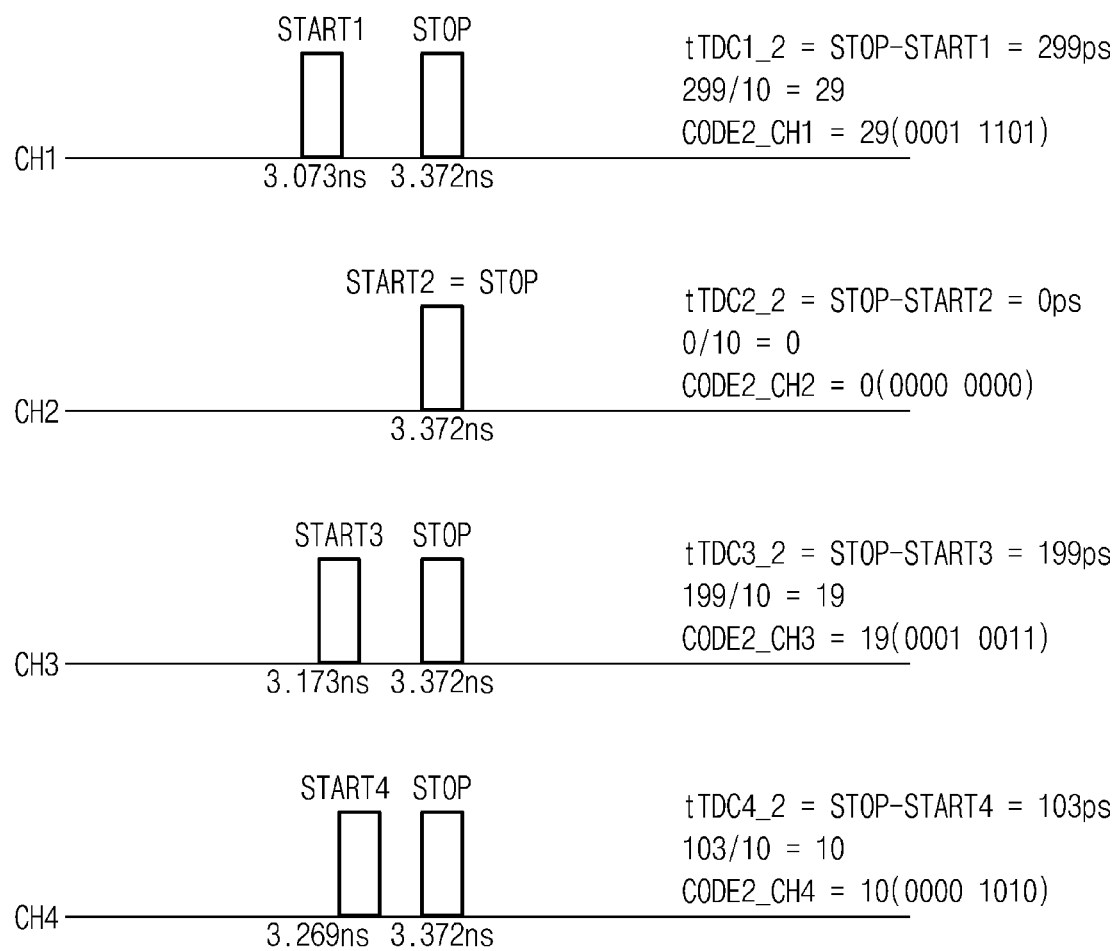
FIG. 11 is a timing diagram of a second edge of a start pulse signal of each channel and a stop pulse signal for describing operations of a TDC and a binary encoder included in each delay control signal generator of a fan-out buffer of FIG. 1 according to example embodiments.

FIG. 11 is a timing diagram of a second edge of a start pulse signal of each channel and a stop pulse signal for describing operations of a TDC and a binary encoder included in each delay control signal generator of a fan-out buffer of FIG. 1 according to example embodiments.

In the second skew correction (or the second skew calibration), as in the description given with reference to FIG. 6, it is assumed that the stop pulse signal generator 255 selects the edge tEG2a_CH2 being the slowest from among the skew-calibrated second edges tEG2a_CH1, tEG2a_CH2, tEG2a_CH3, and tEG2a_CH4 as the stop pulse signal STOP. In this case, the edges tEG2a_CH1, tEG2a_CH2, tEG2a_CH3, and tEG2a_CH4 may be selected by the edge-to-pulse converters 250_1 to 250_4.

For example, the right shifter 350 is enabled in response to the third control signal CTRL3, and the selection circuits 370_1 to 370_4 respectively included in the delay signal generators 260_1 to 260_4 outputs the output signals of the first registers 344_1 to 344_4 respectively included in the delay signal generators 260_1 to 260_4 depending on the fourth control signal CTRL4.

Referring to FIGS. 1, 3A, 10, and 11, because a time difference tTDC1_2 between the second edge tEG2a_CH1 (=3.073 ns) of the first start pulse signal START1 and the edge tEG2a_CH2 (=3.372 ns) of the stop pulse signal STOP is 299 ps and the resolution of the first TDC 310_1 of the first delay control signal generator 260_1 is 10 ps, the first TDC 310_1 outputs digital signals corresponding to $29_{10}$, and the first binary encoder 330_1 converts the digital signals corresponding to $29_{10}$ into the binary digital code CODE2_CH1 (=0001 1101).

The binary digital code CODE2_CH1 (=0001 1101) is transferred to the first adder 342_1; because the binary digital code of "0000 0110" is present in the first register 344_1, the first adder 342_1 stores the binary digital code of "0010 0011" in the first register 344_1.

The right shifter 350_1 receives the binary digital code CODE2_CH1 (=0001 1101) and outputs $14.5_{10}$ (=0000 1110.1) to the second adder 362_1 by shifting the binary digital code CODE2_CH1 (=0001 1101) to the right by one bit in response to the third control signal CTRL3. Because "0000 0000" is present in the second register 364_1, the second adder 362_1 stores $14.5_{10}$ (=0000 1110.1) in the second register 364_1.

According to example embodiments, when the right shifter 350 performs a shift right operation, the decimal point described in the specification may be maintained as it is, and a number after the decimal point may be discarded to simplify a configuration of a related circuit. As such, the second adder 362_1 may store not $14.5_{10}$ (=0000 1110.12) but $14_{10}$ (=0000 1110) in the second register 364_1.

The selection circuit 370_1 transfers the first delay control signal De_ctrl1 corresponding to the binary digital code of "0010 0011" stored in the first register 344_1 to the first delay circuit 230_1 in response to the fourth control signal CTRL4 used as a select signal. Accordingly, the delay of the first delay circuit 230_1 is set to 350 ps.

Referring to FIGS. 1, 3A, 10, and 11, because a time difference tTDC2_2 between the second edge tEG2a_CH2 (=3.372 ns) of the second start pulse signal START2 and the edge tEG2a_CH2 (=3.372 ns) of the stop pulse signal STOP is 0 ps and the resolution of the second TDC 310_2 of the second delay control signal generator 260_2 is 10 ps, the second TDC 310_2 outputs digital signals corresponding to $0_{10}$, and the second binary encoder 330_2 of the second delay control signal generator 260_2 converts the digital signals corresponding to $0_{10}$ into the binary digital code CODE2_CH2 (=0000 0000).

The binary digital code CODE2_CH2 (=0000 0000) is transferred to the first adder 342_2 of the second delay control signal generator 260_2; because "0000 0010" is present in the first register 344_2 of the second delay control signal generator 260_2, the first adder 342_2 stores the binary digital code of "0000 0010" in the first register 344_2.

The right shifter 350_2 receives the binary digital code CODE2_CH2 (=0000 0000) and outputs "0000 0000" to the second adder 362_2. Because "0000 0010" is present in the second register 364_2, the second adder 362_2 stores "0000 0010" in the second register 364_2.

The selection circuit 370_2 of the second delay control signal generator 260_2 transfers the second delay control signal De_ctrl2 corresponding to the binary digital code of "0000 0010" stored in the first register 344_2 to the second delay circuit 230_2 in response to the fourth control signal CTRL4. Accordingly, the delay of the second delay circuit 230_2 maintains 20 ps.

Referring to FIGS. 1, 3A, 10, and 11, because a time difference tTDC3_2 between the second edge tEG2a_CH3 (=3.173 ns) of the third start pulse signal START3 and the edge tEG2a_CH2 (=3.372 ns) of the stop pulse signal STOP is 199 ps and the resolution of the third TDC 310_3 of the third delay control signal generator 260_3 is 10 ps, the third TDC 310_3 outputs digital signals corresponding to $19_{10}$, and the third binary encoder 330_3 of the third delay control signal generator 260_3 converts the digital signals corresponding to $19_{10}$ into the binary digital code CODE2_CH3 (=0001 0011).

The binary digital code CODE2_CH3 (=0001 0011) is transferred to the first adder 342_3 of the third delay control signal generator 260_3; because "0000 0000" is present in the first register 344_3 of the third delay control signal generator 260_3, the first adder 342_3 stores the binary digital code of "0001 0011" in the first register 344_3.

The right shifter 350_3 receives the binary digital code CODE2_CH3 (=0001 0011) and outputs $9.5_{10}$ (=00001001.12) to the second adder 362_3. Because "0000 0000" is present in the second register 364_3, the second adder 362_3 stores $9.5_{10}$ (=00001001.1) in the second register 364_3. For example, the second adder 362_3 may store not $9.5_{10}$ (=0000 1001.12) but $9_{10}$ (=0000 1001) in the second register 364_3.

The selection circuit 370_3 of the third delay control signal generator 260_3 transfers the third delay control signal De_ctrl3 corresponding to the binary digital code of "0001 0011" stored in the first register 344_3 of the third delay control signal generator 260_3 to the third delay circuit 230_3 in response to the fourth control signal CTRL4. Accordingly, the delay of the third delay circuit 230_3 is set to 190 ps.

Referring to FIGS. 1, 3A, 10, and 11, because a time difference tTDC4_2 between the second edge tEG2a_CH3 (=3.269 ns) of the fourth start pulse signal START4 and the edge tEG2a_CH2 (=3.372 ns) of the stop pulse signal STOP is 103 ps and the resolution of the fourth TDC 310_4 of the fourth delay control signal generator 260_4 is 10 ps, the fourth TDC 310_4 outputs digital signals corresponding to $10_{10}$, and the fourth binary encoder 330_4 of the fourth delay control signal generator 260_4 converts the digital signals corresponding to $10_{10}$ into the binary digital code CODE2_CH4 (=0000 1010).

The binary digital code CODE2_CH4 (=0000 1010) is transferred to the first adder 342_4 of the fourth delay control signal generator 260_4; because "0000 0110" is present in the first register 344_4 of the fourth delay control signal generator 260_4, the first adder 342_4 stores the binary digital code of "0001 0000" in the first register 344_4.

The right shifter 350_4 receives the binary digital code CODE2_CH4 (=0000 1010) and outputs $5_{10}$ (=00000101) to the second adder 362_4. Because "0000 0000" is present in the second register 364_4, the second adder 362_4 stores "00000101" in the second register 364_4.

The selection circuit 370_4 of the fourth delay control signal generator 260_4 transfers the fourth delay control signal De_ctrl4 corresponding to the binary digital code CODE1_CH4 (=0001 0000) stored in the first register 344_4 of the fourth delay control signal generator 260_4 to the fourth delay circuit 230_4 in response to the fourth control signal CTRL4. Accordingly, the delay of the fourth delay circuit 230_4 is set to 160 ps.

FIG. 12 is a diagram illustrating tables including delays of components before and after skew calibration for second edges, which is performed in a fan-out buffer of FIG. 1 according to example embodiments.

A third table TABLE3 of FIG. 12 shows delays of components before skew calibration for second edges, and a fourth table TABLE4 of FIG. 12 shows delays of components after skew calibration for the second edges.

Figure 13:
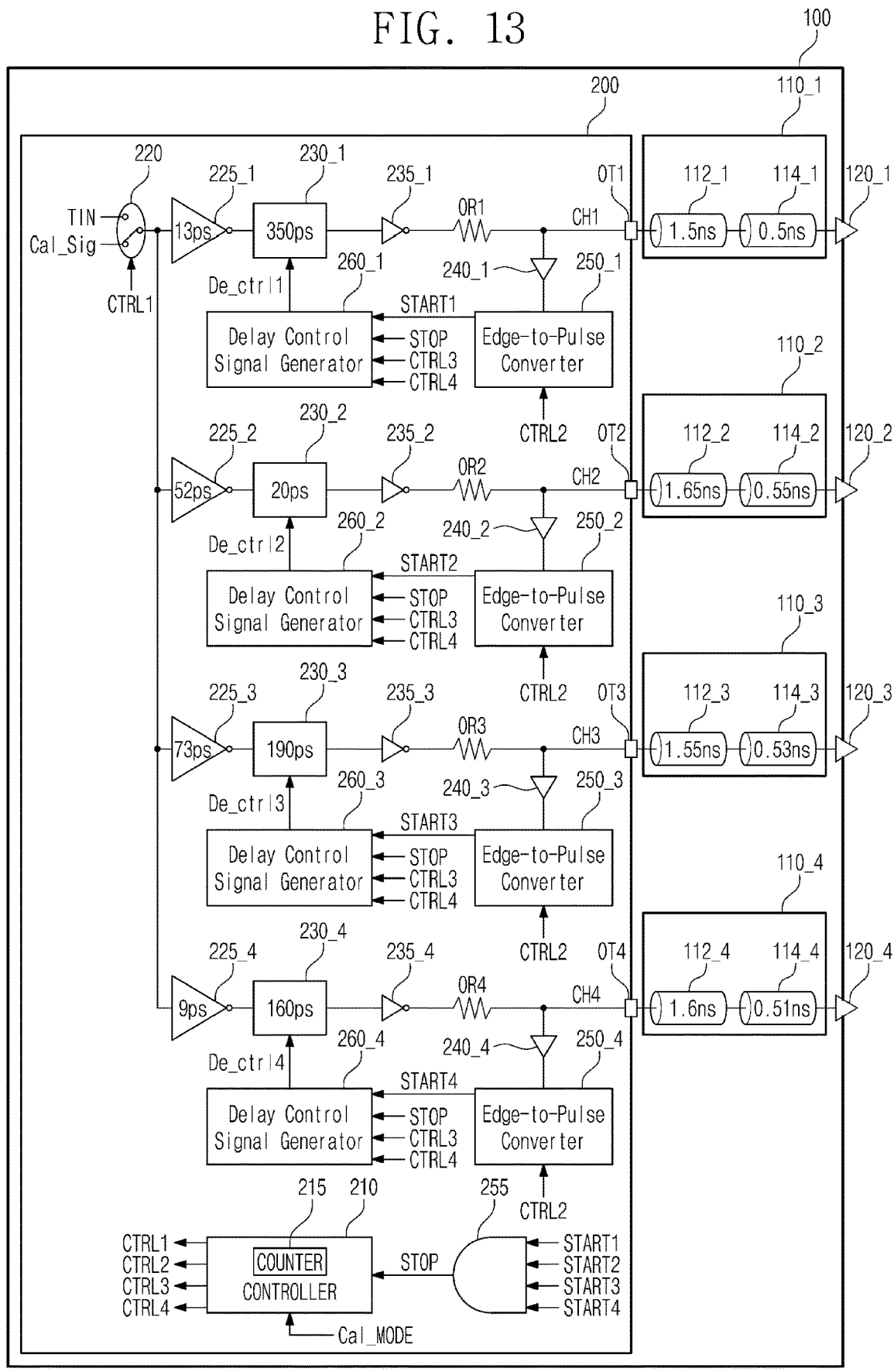
FIG. 13 is a diagram illustrating delays set to delay circuits after skew calibration is performed on second edges, in a fan-out buffer of FIG. 1 according to example embodiments.

FIG. 13 is a diagram illustrating delays set to delay circuits after skew calibration is performed on second edges, in a fan-out buffer of FIG. 1 according to example embodiments.

Referring to FIG. 13, the delay of the first delay circuit 230_1 is set to 350 ps depending on the first delay control signal De_ctrl1 to which the time difference tTDC1_2 (=290 ps) is applied, the delay of the second delay circuit 230_2 is set to 20 ps depending on the second delay control signal De_ctrl2 in which the time difference tTDC2_2 (=0 ps) is applied, the delay of the third delay circuit 230_3 is set to 190 ps depending on the third delay control signal De_ctrl3 in which the time difference tTDC3_2 (=190 ps) is applied, and the delay of the fourth delay circuit 230_4 is set to 160 ps depending on the fourth delay control signal De_ctrl4 to which the time difference tTDC4_2 (=100 ps) is applied.

FIG. 14 is a timing diagram of output signals of edge-to-pulse converters after skew calibration is performed on second edges, in a fan-out buffer of FIG. 1 according to example embodiments.

Referring to FIGS. 12B, 13, and 14, in the calibration mode, the calibration test signal Cal_Sig is transferred to the respective channels CH1 to CH4 through the switch circuit 220.

Three edges corresponding to three pulses included in each of the edge-to-pulse converters 250_1 to 250_4 are illustrated in FIG. 14.

When each of the edges tEG1a_CHL tEG2a_CHL and tEG3a_CH1 of the first start pulse signal START1 illustrated in FIG. 10 is delayed by a time difference tTDC1_2 (=290 ps), edges tEG1b_CHL tEG2b_CHL and tEG3b_CH1 of the first start pulse signal START1 are formed as illustrated in FIG. 14.

Because the time difference tTDC2_2 is 0 ps, the edges tEG1a_CH2, tEG2a_CH2, and tEG3a_CH2 of the second start pulse signal START2 illustrated in FIG. 10 are identical to edges tEG1b_CH2, tEG2b_CH2, and tEG3b_CH2 of the second start pulse signal START2 illustrated in FIG. 14.

When each of the edges tEG1a_CH3, tEG2a_CH3, and tEG3a_CH3 of the third start pulse signal START3 illustrated in FIG. 10 is delayed by a time difference tTDC3_2 (=190 ps), edges tEG1b_CH3, tEG2b_CH3, and tEG3b_CH3 of the third start pulse signal START3 are formed as illustrated in FIG. 14.

When each of the edges tEG1a_CH4, tEG2a_CH4, and tEG3a_CH4 of the fourth start pulse signal START4 illustrated in FIG. 10 is delayed by a time difference tTDC4_2 (=100 ps), edges tEG1b_CH4, tEG2b_CH4, and tEG3b_CH4 of the fourth start pulse signal START4 are formed as illustrated in FIG. 14.

Referring to FIG. 14, it is assumed that, in a third skew calibration, the stop pulse signal generator 255 select the edge tEG3b_CH2 being the slowest from among the skew-calibrated third edges tEG3b_CH1, tEG3b_CH2, tEG3b_CH3, and tEG3b_CH4 as the stop pulse signal STOP.

The right shifter 350_i is enabled in response to the third control signal CTRL3, and the selection circuit 370_i outputs the output signal of the first register 344_i in response to the fourth control signal CTRL4.

Referring to FIGS. 3A, 13, 14, and 15, because the time difference between the third edge tEG3b_CH1 (=4.363 ns) of the first start pulse signal START1 and the edge tEG3b_CH2 (=4.472 ns) of the stop pulse signal STOP is 109 ps and the resolution of the first TDC 310_1 of the first delay control signal generator 260_1 is 10 ps, the first TDC 310_1 outputs digital signals corresponding to $10_{10}$, and the first binary encoder 330_1 converts the digital signals corresponding to $10_{10}$ into the binary digital code CODE3_CH1 (=0000 1010).

The binary digital code CODE3_CH1 (=0000 1010) is transferred to the first adder 342_1; because the binary digital code of "0010 0011" is present in the first register 344_1, the first adder 342_1 stores the binary digital code of $45_{10}$ (=0010 $1101_2$) in the first register 344_1.

The right shifter 350_1 receives the binary digital code CODE3_CH1 (=0000 1010) and outputs $5_{10}$ (=0000 0101) to the second adder 362_1. Because 14 (=0000 1110) is present in the second register 364_1, the second adder 362_1 stores $19_{10}$ (=0001 0011) in the second register 364_1.

The selection circuit 370_1 transfers the first delay control signal De_ctrl1 corresponding to the binary digital code of "$45_{10}$ (=0010 1101)" stored in the first register 344_1 to the first delay circuit 230_1 in response to the fourth control signal CTRL4. Accordingly, the delay of the first delay circuit 230_1 is set to 450 ps.

Referring to FIGS. 3A, 13, 14, and 15, because the time difference between the third edge tEG3b_CH2 (=4.472 ns) of the second start pulse signal START2 and the edge tEG3b_CH2 (=4.472 ns) of the stop pulse signal STOP is 0 ps and the resolution of the second TDC 310_2 of the second delay control signal generator 260_2 is 0 ps, the second TDC 310_2 outputs digital signals corresponding to Om, and the second binary encoder 330_2 of the second delay control signal generator 260_2 converts the digital signals corresponding to Om into the binary digital code CODE3_CH2.

The binary digital code CODE3_CH2 (=0000 0000) is transferred to the first adder 342_2 of the second delay control signal generator 260_2; because "210 (=0000 0010)" is present in the first register 344_2 of the second delay control signal generator 260_2, the first adder 342_2 stores the binary digital code of "0000 00102" in the first register 344_2.

The right shifter 350_2 receives the binary digital code CODE3_CH2 (=0000 0000) and outputs $0_{10}$ (=0000 0000) to the second adder 363_2. Because "$2_{10}$ (=0000 0010)" is present in the second register 364_2, the second adder 363_2 stores "$2_{10}$ (=0000 0010)" in the second register 364_2.

The selection circuit 370_2 of the second delay control signal generator 260_2 transfers the second delay control signal De_ctrl2 corresponding to the binary digital code of "0000 0010" stored in the first register 344_2 of the second delay control signal generator 260_2 to the second delay circuit 230_2 in response to the fourth control signal CTRL4. Accordingly, the delay of the second delay circuit 230_2 maintains 20 ps.

Referring to FIGS. 3A, 13, 14, and 15, because the time difference between the third edge tEG3b_CH3 (=4.423 ns) of the third start pulse signal START3 and the edge tEG3b_CH2 (=4.472 ns) of the stop pulse signal STOP is 49 ps and the resolution of the third TDC 310_3 of the third delay control signal generator 260_3 is 10 ps, the third TDC 310_2 outputs digital signals corresponding to $4_{10}$, and the third binary encoder 330_3 of the third delay control signal generator 260_3 converts the digital signals corresponding to $4_{10}$ into the binary digital code CODE3_CH3 (=0000 0100).

The binary digital code CODE3_CH3 (=0000 0100) is transferred to the first adder 342_3 of the third delay control signal generator 260_3; because "$19_{10}$ (=0001 0011)" is present in the first register 344_3 of the third delay control signal generator 260_3, the first adder 342_3 stores the binary digital code of "$23_{10}$ (=0001 0111)" in the first register 344_3.

The right shifter 350_3 receives the binary digital code CODE3_CH3 (=0000 0100) and outputs $2_{10}$ (=0000 0010) to the second adder 362_3. Because $9.5_{10}$ (=00001001.1) is present in the second register 364_3, the second adder 362_3 stores $11.5_{10}$ (=00001011.12) in the second register 364_3.

The selection circuit 370_3 of the third delay control signal generator 260_3 transfers the third delay control signal De_ctrl3 corresponding to the binary digital code of "$23_{10}$ (=0001 0111)" stored in the first register 344_3 to the third delay circuit 230_3 in response to the fourth control signal CTRL4. Accordingly, the delay of the third delay circuit 230_3 is set to 230 ps.

Referring to FIGS. 3A, 13, 14, and 15, because the time difference between the third edge tEG3b_CH4 (=4.389 ns) of the fourth start pulse signal START4 and the edge tEG3b_CH2 (=4.472 ns) of the stop pulse signal STOP is 83 ps and the resolution of the fourth TDC 310_4 is 10 ps, the fourth TDC 310_4 outputs digital signals corresponding to $8_{10}$, and the fourth binary encoder 330_4 converts the digital signals corresponding to $8_{10}$ into the binary digital code CODE3_CH4 (=0000 1000).

The binary digital code CODE3_CH4 (=0000 1000) is transferred to the first adder 342_4; because the binary digital code of "$16_{10}$ (=0001 0000)" is present in the first register 344_4, the first adder 342_4 stores the binary digital code of $24_{10}$ (=0001 1000) in the first register 344_4.

The right shifter 350_4 receives the binary digital code CODE3_CH4 (=0000 1000) and outputs $4_{10}$ (=0000 0100) to the second adder 362_4. Because $5_{10}$ (=0000 1001) is present in the second register 364_4, the second adder 362_4 stores $9_{10}$ (=0001 0001) in the second register 364_4.

The selection circuit 370_4 transfers the fourth delay control signal De_ctrl4 corresponding to the binary digital code of "$24_{10}$ (=0001 1000)" stored in the first register 344_4 to the fourth delay circuit 230_4 in response to the fourth control signal CTRL4. Accordingly, the delay of the fourth delay circuit 230_4 is set to 240 ps.

FIG. 15 is a diagram illustrating tables including delays of components before and after skew calibration for third edges, which is performed in a fan-out buffer of FIG. 1 according to example embodiments.

A fifth table TABLE5 of FIG. 15 includes delays of components after skew calibration is performed on second edges.

After skew calibration is performed on the second edges, with regard to the respective channels CH1 to CH4, Delay indicates delays set to the delay circuits 230_1 to 230_4, tEG1b represents a time point at which the first edge is generated, tEG2b represents a time point at which the second edge is generated, tEG3b represents a time point at which the third edge is generated, and tSIGa is a sum of "tMLC+tF+tEG1b".

A sixth table TABLE6 of FIG. 15 includes delays of components after skew calibration is performed on third edges.

After skew calibration is performed on the third edges, with regard to the respective channels CH1 to CH4, Delay indicates delays set to the delay circuits 230_1 to 230_4, tEG1c represents a time point at which the first edge is generated, tEG2c represents a time point at which the second edge is generated, tEG3c represents a time point at which the third edge is generated, and tSIGb is a sum of "tMLC+tTF+tEGc". A skew between the tSIGb of the second channel CH2 being the fastest and the tSIGb of the first channel CH1 being the slowest of 191 ns is present in tSIGb of each of the channels CH1 to CH4.

Figure 16:
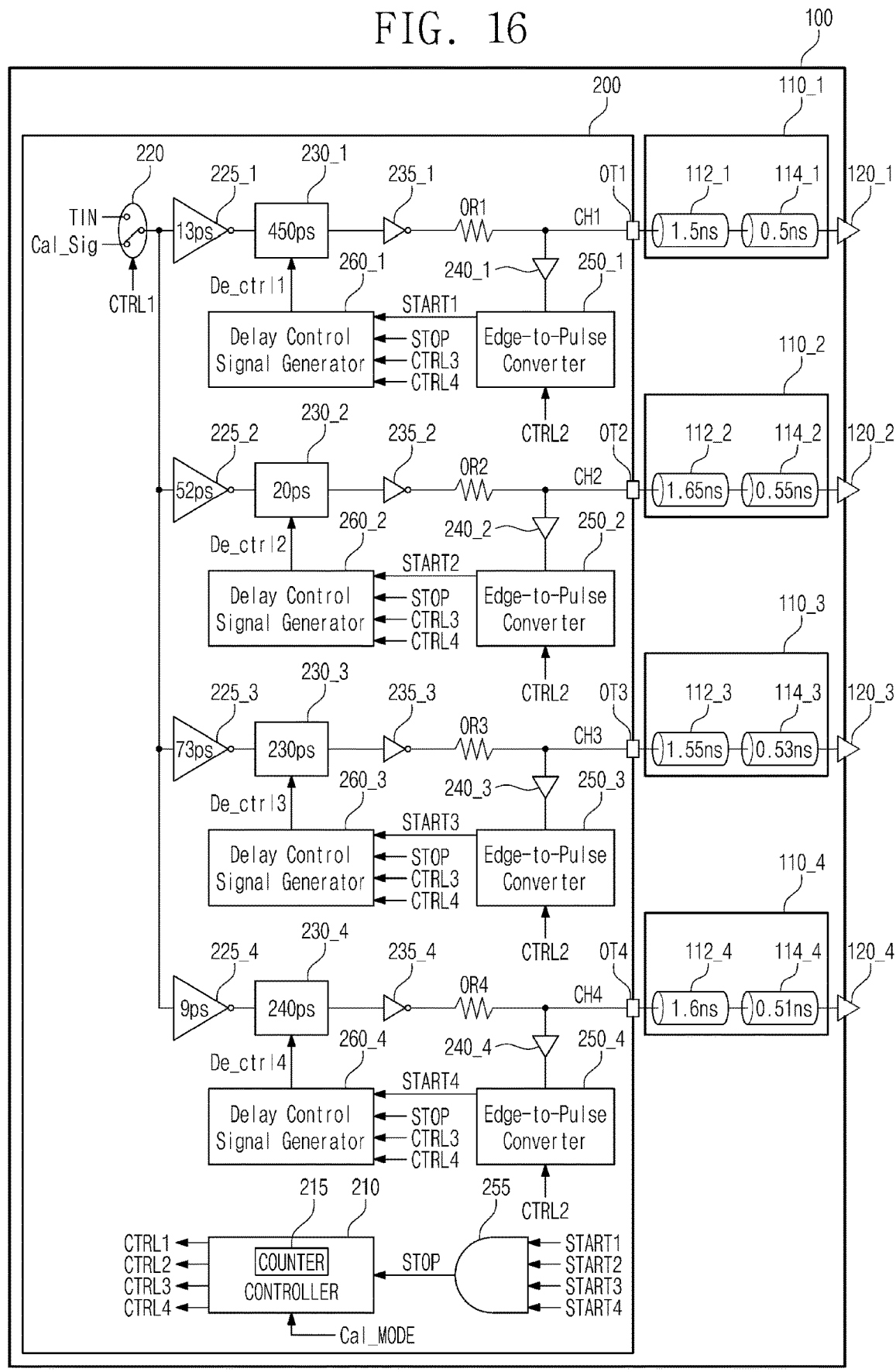
FIG. 16 is a diagram illustrating delays set to delay circuits after skew calibration is performed on third edges, in a fan-out buffer of FIG. 1 according to example embodiments.

FIG. 16 is a diagram illustrating delays set to delay circuits after skew calibration is performed on third edges, in a fan-out buffer of FIG. 1 according to example embodiments.

As illustrated in FIG. 16, when skew correction is performed on the third edges respectively included in the start pulse signals START1 to START4, the delay of the first delay circuit 230_1 is set to 450 ps, the delay of the second delay circuit 230_2 is set to 20 ps is set, the delay of the third delay circuit 230_3 is set to 230 ps, and the delay of the fourth delay circuit 230_4 is set to 240 ps.

FIG. 17 is a diagram illustrating tables including delays before and after a final skew calibration according to example embodiments.

A seventh table TABLE7 of FIG. 17 includes delays of components after skew calibration is performed on third edges. The seventh table TABLE7 is identical to the fifth table TABLE5 of FIG. 15.

An eighth table TABLE8 of FIG. 17 includes delays of components after the final skew calibration.

Referring to the eighth table TABLE8, after the final skew calibration, with regard to the respective channels CH1 to CH4, tEG1$d$ represents a time point at which the first edge is generated, tEG2$d$ represents a time point at which the second edge is generated, tEG3$d$ represents a time point at which the third edge is generated, and tSIGc is a sum of "tMLC+tTF+tEGd". A skew between the tSIGc (=2.268 ns) of the first channel CH1 being the fastest and the tSIGc (=2.272 ns) of the second channel CH2 being the slowest of 0.004 ns is present in tSIGc of each of the channels CH1 to CH4. Accordingly, the DUT may be accurately tested by using signals having small skews after performing the skew calibration operations disclosed above.

Because the number of edges generated for each of the channels CH1 to CH4 is 3 and there is no edge to be additionally calibrated except for the third edges of the channels CH1 to CH4, the third edges are aligned in a state where skew calibration is performed on the third edges.

However, as illustrated in FIGS. 10 and 14, the second edge and the third edge are calibrated excessively, that is, twice.

Accordingly, after the alignment for all the edges is completed (or after skew calibration is performed on all the edges), it is necessary to calibrate an error associated with the first to fourth transmission lines 110_1 to 110_4. The second accumulator circuit 360_$i$ illustrated in FIG. 3A is used to calibrate the error.

After skew calibration is completely performed on the third edges, the controller 210 outputs the fourth control signal CTRL4 to the selection circuits 370_1 to 370_4 of the delay control signal generators 260_1 to 260_4.

Accordingly, when the final skew calibration is performed, the selection circuits 370_1 to 370_4 output the output signals of the subtractors 366_1 to 366_4 of the delay control signal generators 260_1 to 260_4 to the delay circuits 230_1 to 230_4.

Figure 18:
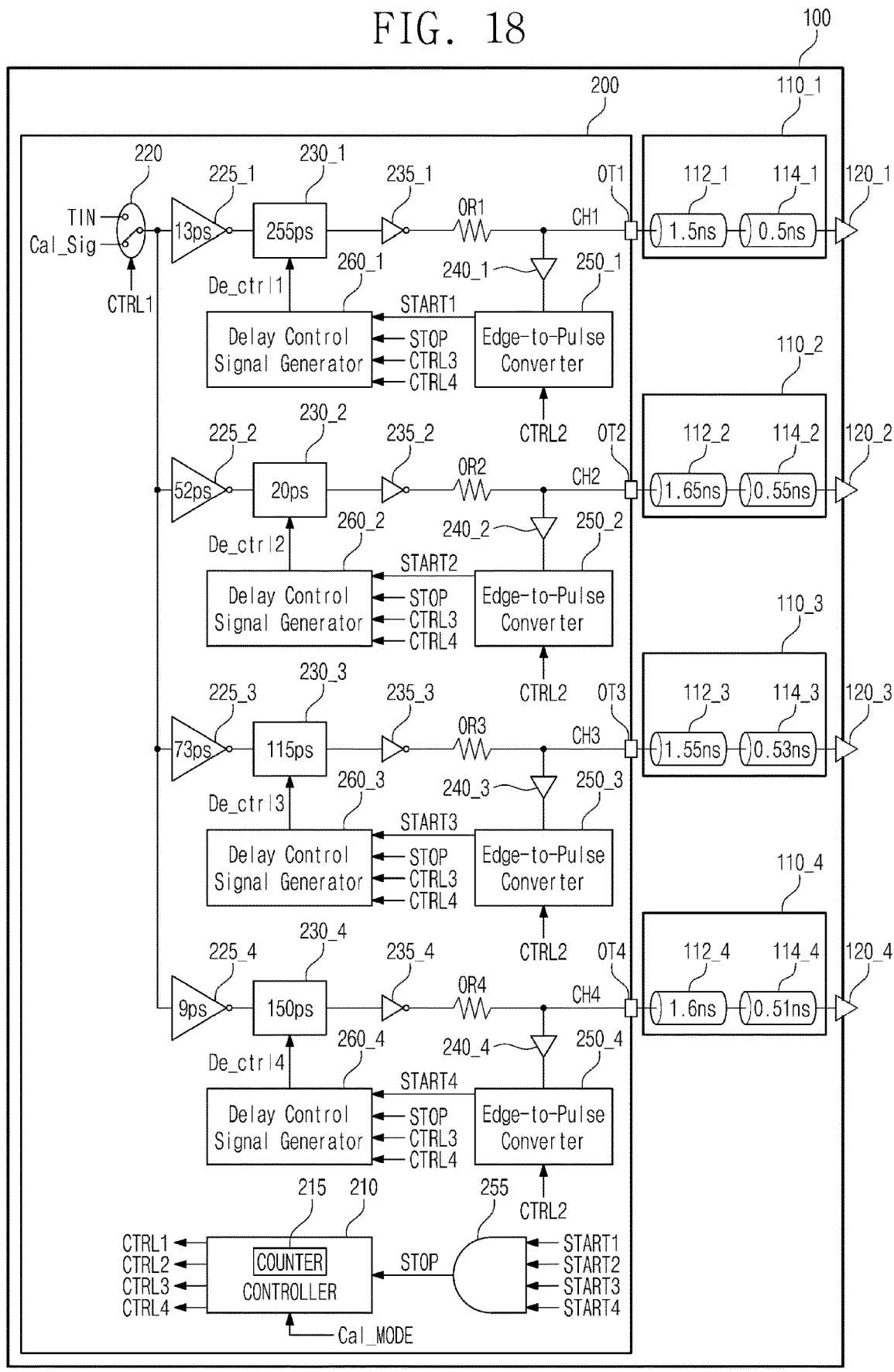
FIG. 18 is a diagram illustrating delays set to delay circuits after final skew calibration performed in a fan-out buffer of FIG. 1 according to example embodiments.

After the final skew calibration is performed, the subtractor 366_1 of the first delay control signal generator 260_1 subtracts the code $19.5_{10}$ (=00010011.1) stored in the second register 364_1 from the code $45_{10}$ (=00101101) stored in the first register 344_1 and outputs the first delay control signal De_ctrl1 corresponding to a subtraction result, that is, $25.5_{10}$ (=00011001.12) to the first delay circuit 230_1. Accordingly, as illustrated in FIG. 18, the delay of the first delay circuit 230_1 is finally set to 255 ps.

After the final skew calibration is performed, the subtractor 366_2 of the second delay control signal generator 260_2 subtracts the code 0m (=0000 0000) stored in the second register 364_2 from the code $2_{10}$ (=0000 0010) stored in the first register 344_2 and outputs the second delay control signal De_ctrl2 corresponding to a subtraction result, that is, $2_{10}$ (=0000 0010) to the second delay circuit 230_2. Accordingly, as illustrated in FIG. 18, the delay of the second delay circuit 230_2 is finally set to 20 ps.

After the final skew calibration is performed, the subtractor 366_3 of the third delay control signal generator 260_3 subtracts the code $11.5_{10}$ (=00001011.1) stored in the second register 364_3 from the code $23_{10}$ (=0001 0111) stored in the first register 344_3 and outputs the third delay control signal De_ctrl3 corresponding to a subtraction result, that is, $11.5_{10}$ (=00011001.12) to the third delay circuit 230_3. Accordingly, as illustrated in FIG. 18, the delay of the third delay circuit 230_3 is finally set to 115 ps.

After the final skew calibration is performed, the subtractor 366_4 of the fourth delay control signal generator 260_4 subtracts the code $9_{10}$ (=0001 0001) stored in the second register 364_4 from the code $24_{10}$ (=0001 1000) stored in the first register 344_4 and outputs the fourth delay control signal De_ctrl4 corresponding to a subtraction result, that is, $15_{10}$ (=0000 1111) to the fourth delay circuit 230_4. Accordingly, as illustrated in FIG. 18, the delay of the fourth delay circuit 230_4 is finally set to 150 ps.

A fan-out buffer according to an embodiment of the present disclosure is capable of simultaneously controlling or adjusting a skew due to an internal circuit of the fan-out buffer and a skew due to an external circuit of the fan-out buffer.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. A fan-out buffer comprising:
   a first channel including a first delay circuit configured to adjust a first delay time of a calibration test signal depending on a first delay control signal;
   a second channel including a second delay circuit configured to adjust a second delay time of the calibration test signal depending on a second delay control signal;
   a first edge-to-pulse converter configured to detect a first edge included in a first time domain reflectometry (TDR) waveform of an output terminal of the first channel and to generate a first start pulse signal including a first pulse;
   a second edge-to-pulse converter configured to detect a first edge included in a second TDR waveform of an output terminal of the second channel and to generate a second start pulse signal including a second pulse;
   a stop pulse signal generator configured to generate a stop pulse signal including a first stop pulse by performing an AND operation on the first pulse and the second pulse; and
   a first delay control signal generator configured to calculate a phase difference between the first pulse and the first stop pulse and to generate the first delay control signal by using a calculation result such that a skew between the first pulse and the second pulse is calibrated.

2. The fan-out buffer of claim 1, wherein the first edge-to-pulse converter includes:
   a high pass filter configured to perform high pass filtering on the first TDR waveform;

an amplifier configured to amplify an output signal of the high pass filter and to detect the first edge;
a buffer configured to buffer an output signal of the amplifier;
a D-flip-flop including an input terminal, an output terminal, an inversion output terminal, and a clock terminal, and configured to transfer a signal of the input terminal to the output terminal in response to an output signal of the buffer input to the clock terminal;
a delay circuit configured to receive an output signal from the inversion output terminal of the D-flip-flop; and
an AND gate configured to generate the first start pulse signal based on an output signal from the output terminal, an output signal from the delay circuit, and a control signal.

3. The fan-out buffer of claim 1, wherein the first delay control signal generator includes:
a time-to-digital converter configured to generate digital signals corresponding to the phase difference;
an encoder configured to generate a first digital code by encoding the digital signals;
a first accumulator circuit configured to generate a first output digital code by receiving and accumulating the first digital code;
a right shifter configured to determine whether to shift the first digital code to the right by one bit, depending on a first control signal;
a second accumulator circuit configured to generate an accumulation digital code by receiving and accumulating a second digital code output from the right shifter and to generate a second output digital code by subtracting the accumulation digital code from the first output digital code; and
a selection circuit configured to output one of the first output digital code and the second output digital code as the first delay control signal depending on a second control signal.

4. The fan-out buffer of claim 3, further comprising:
a controller configured to:
generate the first and second control signals based on determining whether the first stop pulse corresponds to any stop pulse among a plurality of stop pulses included in the stop pulse signal,
wherein, the fan-out buffer is configured such that when it is determined that the first stop pulse is a first stop pulse among the plurality of stop pulses, the right shifter disables in response to the first control signal and the selection circuit outputs the first output digital code in response to the second control signal.

5. The fan-out buffer of claim 4, wherein, the fan-out buffer is configured such that when it is determined that the first stop pulse is not the first stop pulse and the last stop pulse among the plurality of stop pulses, the right shifter enables in response to the first control signal and the selection circuit outputs the first output digital code in response to the second control signal.

6. The fan-out buffer of claim 5, wherein, the fan-out buffer is configured such that when it is determined that the first stop pulse is the last stop pulse among the plurality of stop pulses, the selection circuit outputs the first output digital code and then outputs the second output digital code in response to the second control signal.

7. The fan-out buffer of claim 1, wherein the first pulse is one of "k" pulses included in the first start pulse signal,
wherein the second pulse is one of "k" pulses included in the second start pulse signal,
wherein the first stop pulse is one of "k" stop pulses included in the stop pulse signal, and
wherein the first delay control signal generator includes:
a time-to-digital converter configured to generate "k" calculation values by calculating phase differences between the "k" pulses of the first start pulse signal and the "k" stop pulses of the stop pulse signal, respectively;
a first accumulator circuit configured to generate and store a first value by accumulating the "k" calculation values;
a second accumulator circuit configured to accumulate second to k-th calculation values of the "k" calculation values and to generate and store a second value corresponding to half the accumulated value;
a subtractor configured to generate a third value by subtracting the second value from the first value; and
a selection circuit configured to output one of the first value and the second value as the first delay control signal depending on a control signal.

8. The fan-out buffer of claim 7, wherein, the fan-out buffer is configured such that when it is determined that the first stop pulse is a k-th stop pulse among the k" stop pulses, the selection circuit outputs the first value, and then outputs the second value in response to the control signal.

9. The fan-out buffer of claim 1, further comprising:
a second delay control signal generator configured to calculate a phase difference between the second pulse and the first stop pulse and to generate the second delay control signal by using a calculation result such that the skew between the first pulse and the second pulse is calibrated.

10. A probe card comprising:
first and second probe tips;
a fan-out buffer including:
    a first channel including a first delay circuit configured to adjust a first delay time of a calibration test signal depending on a first delay control signal,
    a second channel including a second delay circuit configured to adjust a second delay time of the calibration test signal depending on a second delay control signal,
    a first edge-to-pulse converter configured to detect a first edge included in a first time domain reflectometry (TDR) waveform of an output terminal of the first channel and to generate a first start pulse signal including a first pulse,
    a second edge-to-pulse converter configured to detect a first edge included in a second TDR waveform of an output terminal of the second channel and to generate a second start pulse signal including a second pulse,
    a stop pulse signal generator configured to generate a stop pulse signal including a first stop pulse by performing an AND operation on the first pulse and the second pulse, and
    a first delay control signal generator configured to calculate a phase difference between the first pulse and the first stop pulse and to generate the first delay control signal by using a calculation result such that a skew between the first pulse and the second pulse is calibrated;
a first transmission circuit connected between the first channel and the first probe tip; and
a second transmission circuit connected between the second channel and the second probe tip.

11. The probe card of claim 10, wherein the first edge-to-pulse converter includes:

a high pass filter configured to perform high pass filtering on the first TDR waveform;
an amplifier configured to amplify an output signal of the high pass filter and to detect the first edge;
a buffer configured to buffer an output signal of the amplifier;
a D-flip-flop including an input terminal, an output terminal, an inversion output terminal, and a clock terminal, and configured to transfer a signal of the input terminal to the output terminal in response to an output signal of the buffer input to the clock terminal;
a delay circuit configured to receive an output signal from the inversion output terminal of the D-flip-flop; and
an AND gate configured to generate the first start pulse signal based on an output signal from the output terminal, an output signal from the delay circuit, and a control signal.

12. The probe card of claim 10, wherein the first delay control signal generator includes:
a time-to-digital converter configured to generate digital signals corresponding to the phase difference;
an encoder configured to generate a first digital code by encoding the digital signals;
a first accumulator circuit configured to generate a first output digital code by receiving and accumulating the first digital code;
a right shifter configured to determine whether to shift the first digital code to the right by one bit, depending on a first control signal;
a second accumulator circuit configured to generate an accumulation digital code by receiving and accumulating a second digital code output from the right shifter and to generate a second output digital code by subtracting the accumulation digital code from the first output digital code; and
a selection circuit configured to output one of the first output digital code and the second output digital code as the first delay control signal depending on a second control signal.

13. The probe card of claim 12, further comprising:
a controller configured to:
generate the first and second control signals based on determining whether the first stop pulse corresponds to any stop pulse among a plurality of stop pulses included in the stop pulse signal, and
wherein, the probe card is configured such that when it is determined that the first stop pulse is a first stop pulse among the plurality of stop pulses, the right shifter disables in response to the first control signal and the selection circuit outputs the first output digital code in response to the second control signal.

14. The probe card of claim 13, wherein the probe card is configured such that when it is determined that the first stop pulse is not the first stop pulse and the last stop pulse among the plurality of stop pulses, the right shifter enables in response to the first control signal and the selection circuit outputs the first output digital code in response to the second control signal.

15. The probe card of claim 14, wherein the probe card is configured such that when it is determined that the first stop pulse is the last stop pulse among the plurality of stop pulses, the selection circuit outputs the first output digital code and then outputs the second output digital code in response to the second control signal.

16. The probe card of claim 10, wherein the first pulse is one of "k" pulses included in the first start pulse signal, wherein the second pulse is one of "k" pulses included in the second start pulse signal,
wherein the first stop pulse is one of "k" stop pulses included in the stop pulse signal, and
wherein the first delay control signal generator includes:
a time-to-digital converter configured to generate "k" calculation values by calculating phase differences between the "k" pulses of the first start pulse signal and the "k" stop pulses of the stop pulse signal, respectively;
a first accumulator circuit configured to generate and store a first value by accumulating the "k" calculation values;
a second accumulator circuit configured to accumulate second to k-th calculation values of the "k" calculation values and to generate and store a second value corresponding to half the accumulated value;
a subtractor configured to generate a third value by subtracting the second value from the first value; and
a selection circuit configured to output one of the first value and the second value as the first delay control signal depending on a control signal.

17. The probe card of claim 16, wherein, the probe card is configured such that when it is determined that the first stop pulse is a k-th stop pulse among the "k" stop pulses, the selection circuit outputs the first value, and then outputs the second value in response to the control signal.

18. The probe card of claim 10, further comprising:
a second delay control signal generator configured to calculate a phase difference between the second pulse and the first stop pulse and to generate the second delay control signal by using a calculation result such that the skew between the first pulse and the second pulse is calibrated.

19. An operating method of a fan-out buffer which includes a first channel including a first delay circuit configured to adjust a first delay time of a calibration test signal depending on a first delay control signal and a second channel including a second delay circuit configured to adjust a second delay time of the calibration test signal depending on a second delay control signal, the method comprising:
detecting an edge included in a first time domain reflectometry (TDR) waveform on an output terminal of the first channel to generate a first start pulse signal including a first pulse;
detecting an edge included in a second TDR waveform on an output terminal of the second channel to generate a second start pulse signal including a second pulse;
generating a stop pulse signal including a first stop pulse by performing an AND operation on the first pulse and the second pulse; and
calculating a first phase difference between the first pulse and the first stop pulse and generating the first delay control signal by using a calculation result such that a skew between the first pulse and the second pulse is calibrated.

20. The method of claim 19, further comprising:
calculating a second phase difference between the second pulse and the first stop pulse and generating the second delay control signal by using a calculation result such that the skew between the first pulse and the second pulse is calibrated,
wherein the first phase difference is calculated by using a first time-to-digital converter, and
wherein the second phase difference is calculated by using a second time-to-digital converter.

* * * * *